(12) United States Patent
Shibayama et al.

(10) Patent No.: US 11,764,055 B2
(45) Date of Patent: *Sep. 19, 2023

(54) SUBSTRATE PROCESSING METHOD AND SUBSTRATE PROCESSING DEVICE

(71) Applicant: SCREEN Holdings Co., Ltd., Kyoto (JP)

(72) Inventors: Nobuyuki Shibayama, Kyoto (JP); Toru Edo, Kyoto (JP); Hiromichi Kaba, Kyoto (JP)

(73) Assignee: SCREEN Holdings Co., Ltd.

( * ) Notice: Subject to any disclaimer, the term of this patent is extended or adjusted under 35 U.S.C. 154(b) by 0 days.

This patent is subject to a terminal disclaimer.

(21) Appl. No.: 16/081,242

(22) PCT Filed: Mar. 21, 2017

(86) PCT No.: PCT/JP2017/011264
§ 371 (c)(1),
(2) Date: Aug. 30, 2018

(87) PCT Pub. No.: WO2017/164185
PCT Pub. Date: Sep. 28, 2017

(65) Prior Publication Data
US 2019/0035622 A1 Jan. 31, 2019

(30) Foreign Application Priority Data
Mar. 25, 2016 (JP) .................. 2016-061909

(51) Int. Cl.
*H01L 21/02* (2006.01)
*B08B 1/00* (2006.01)
(Continued)

(52) U.S. Cl.
CPC ........ *H01L 21/02057* (2013.01); *B08B 1/002* (2013.01); *B08B 1/04* (2013.01);
(Continued)

(58) Field of Classification Search
CPC ..... B08B 1/002; B08B 1/04; B08B 2203/005; B08B 3/08; B08B 3/10; B08B 7/04;
(Continued)

(56) References Cited

U.S. PATENT DOCUMENTS 5,626,681 A * 5/1997 Nakano ..................... B08B 3/08
134/3
5,759,971 A * 6/1998 Manako ................... C11D 7/08
134/3

(Continued)

FOREIGN PATENT DOCUMENTS

JP H11-300301 A 11/1999
JP 2001-053050 A 2/2001
(Continued)

OTHER PUBLICATIONS

International Preliminary Report on Patentability (Chapter I) dated Oct. 4, 2018 with a Notification from the International Bureau (Form PCT/IB/326) in corresponding PCT International Application No. PCT/JP2017/011264 in Japanese.

(Continued)

*Primary Examiner* — Duy Vu N Deo
*Assistant Examiner* — Christopher Remavege
(74) *Attorney, Agent, or Firm* — OSTROLENK FABER LLP

(57) ABSTRACT

A substrate processing method is provided, which includes: a substrate holding step of causing a substrate holding unit to hold a substrate; an ozone-containing hydrofluoric acid solution supplying step of supplying an ozone-containing hydrofluoric acid solution containing ozone dissolved therein a hydrofluoric acid solution to one major surface of the substrate held by the substrate holding unit; a brush-cleaning step of cleaning the one major surface of the substrate by bringing a cleaning brush into contact with the (Continued)

one major surface of the substrate after the ozone-containing hydrofluoric acid solution supplying step; and an ozone water supplying step of supplying ozone water to the one major surface of the substrate before start of the brush-cleaning step after the ozone-containing hydrofluoric acid solution supplying step or in the brush-cleaning step.

11 Claims, 15 Drawing Sheets

(51) Int. Cl.
  B08B 1/04 (2006.01)
  B08B 3/08 (2006.01)
  B08B 7/04 (2006.01)
  H01L 21/67 (2006.01)
  H01L 21/687 (2006.01)
  B08B 3/10 (2006.01)

(52) U.S. Cl.
  CPC ............ B08B 3/08 (2013.01); B08B 3/10 (2013.01); B08B 7/04 (2013.01); H01L 21/0209 (2013.01); H01L 21/67028 (2013.01); H01L 21/67046 (2013.01); H01L 21/67051 (2013.01); H01L 21/68728 (2013.01); H01L 21/68792 (2013.01); B08B 2203/005 (2013.01)

(58) Field of Classification Search
  CPC ........... H01L 21/02057; H01L 21/0209; H01L 21/67028; H01L 21/67046; H01L 21/67051; H01L 21/68728; H01L 21/68792
  See application file for complete search history.

(56) References Cited

U.S. PATENT DOCUMENTS

| | | | | |
|---|---|---|---|---|
| 6,451,124 B1* | 9/2002 | Brunner | ............ | H01L 21/02049 134/2 |
| 7,378,355 B2* | 5/2008 | Bergman | .......... | H01L 21/02019 257/E21.214 |
| 7,416,611 B2* | 8/2008 | Bergman | .................. | B08B 3/00 134/1 |
| 7,494,549 B2* | 2/2009 | Eitoku | ...................... | C23F 1/18 134/26 |
| 8,070,882 B2* | 12/2011 | Schwab | .................... | B08B 3/10 134/1 |
| 10,854,479 B2* | 12/2020 | Shibayama | ............... | B08B 3/08 |
| 2003/0087532 A1* | 5/2003 | Wu | .................... | H01L 21/31111 257/E21.256 |
| 2003/0209255 A1* | 11/2003 | Brown | ................ | H01L 21/6708 134/1.1 |
| 2004/0031503 A1* | 2/2004 | Eitoku | ............. | H01L 21/67051 134/2 |
| 2004/0187896 A1* | 9/2004 | Konishi | .................. | B08B 3/024 134/33 |
| 2005/0271985 A1* | 12/2005 | Miya | .................... | C11D 17/041 430/323 |
| 2006/0011214 A1* | 1/2006 | Liu | .......................... | B08B 3/08 134/2 |
| 2006/0219260 A1 | 10/2006 | Iwami et al. | | |
| 2008/0156349 A1* | 7/2008 | Kim | .................... | H01L 21/02052 134/3 |
| 2009/0145457 A1* | 6/2009 | Schwab | ............ | H01L 21/02057 134/4 |
| 2009/0293919 A1* | 12/2009 | Katoh | ................ | H01L 21/67051 134/33 |
| 2010/0252070 A1* | 10/2010 | Okuuchi | ............ | H01L 21/02052 134/2 |
| 2013/0312790 A1 | 11/2013 | Ishibashi | .......................... | 134/6 |
| 2016/0074913 A1 | 3/2016 | Hanawa et al. | | |
| 2017/0092530 A1* | 3/2017 | Kaba | ................ | H01L 21/68792 |
| 2017/0092532 A1* | 3/2017 | Kaba | ................ | H01L 21/67028 |

FOREIGN PATENT DOCUMENTS

| | | | | |
|---|---|---|---|---|
| JP | 2001053050 | A | * | 2/2001 |
| JP | 2002-198345 | A | | 7/2002 |
| JP | 2003-218085 | A | | 7/2003 |
| JP | 2003218085 | A | * | 7/2003 |
| JP | 2005-174961 | A | | 6/2005 |
| JP | 2005174961 | A | * | 6/2005 |
| JP | 2006-278957 | A | | 10/2006 |
| JP | 2011-077144 | A | | 4/2011 |
| JP | 2014-003273 | A | | 1/2014 |

OTHER PUBLICATIONS

International Preliminary Report on Patentability (Chapter I) dated Oct. 4, 2018 with a Notification from the International Bureau (Form PCT/IB/338) in corresponding PCT International Application No. PCT/JP2017/011264 in English.

International Search Report dated Apr. 25, 2017 in corresponding PCT International Application No. PCT/JP2017/011264.

Written Opinion dated Apr. 25, 2017 in corresponding PCT International Application No. PCT/JP2017/011264.

* cited by examiner

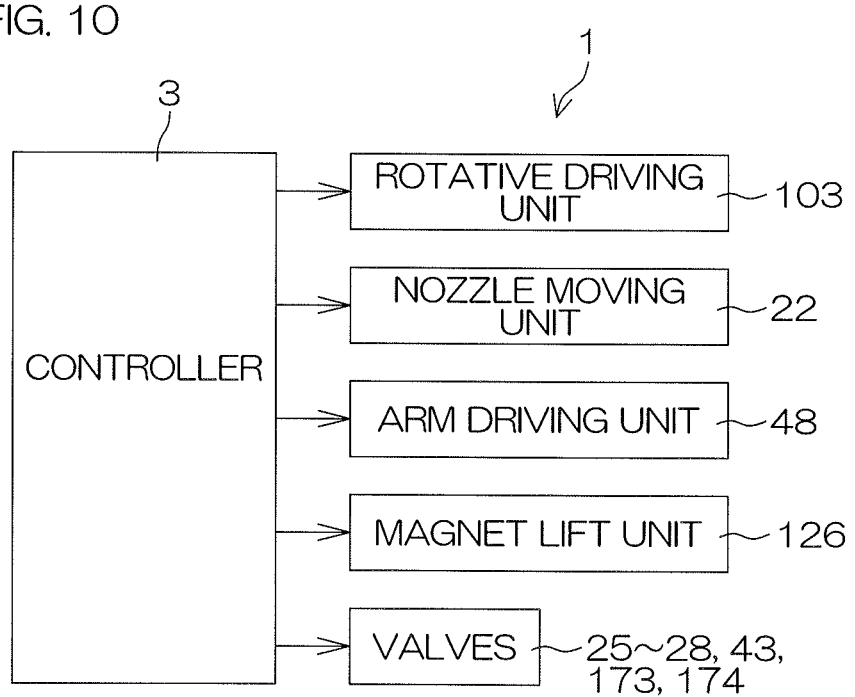

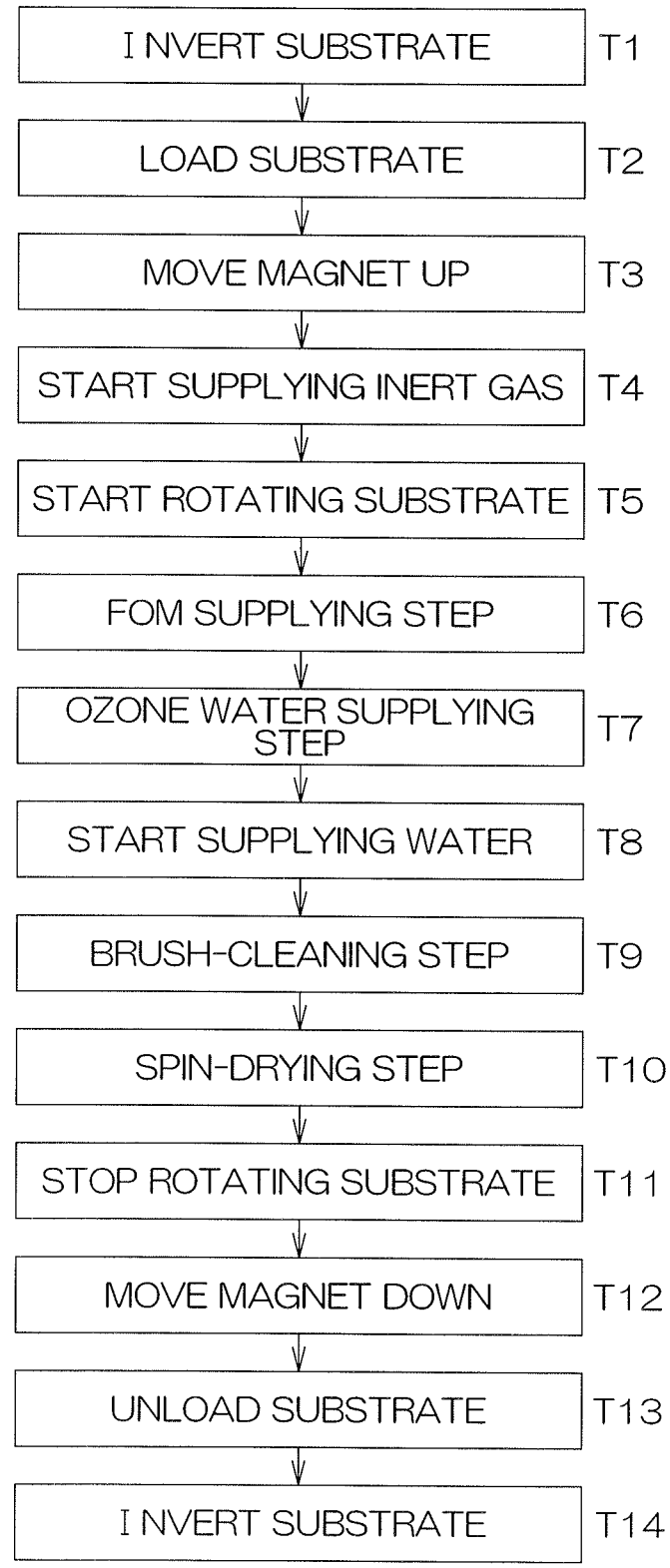

SUBSTRATE PROCESSING METHOD AND SUBSTRATE PROCESSING DEVICE

CROSS-REFERENCE TO RELATED APPLICATIONS

The present application is a 35 U.S.C. §§ 371 national phase conversion of PCT/JP2017/011264, filed Mar. 21, 2017, which claims priority to Japanese Patent Application No. 2016-061909, filed Mar. 25, 2016, the contents of both of which are incorporated herein by reference. The PCT International Application was published in the Japanese language.

TECHNICAL FIELD

The present invention relates to a substrate processing method and a substrate processing apparatus for processing a major surface of a substrate. Examples of the substrate to be processed to be processed include semiconductor wafers, substrates for liquid crystal display devices, substrates for plasma display devices, substrates for FED (Field Emission Display) devices, substrates for optical disks, substrates for magnetic disks, substrates for magneto-optical disks, substrates for photo masks, ceramic substrates, and substrates for solar cells.

BACKGROUND ART

In semiconductor device production processes, it is indispensable to perform a substrate cleaning process for cleaning a substrate such as a semiconductor wafer between respective process steps. A substrate processing apparatus of a single substrate processing type adapted to clean a single substrate at a time, for example, includes a spin chuck which generally horizontally holds and rotates the substrate, a cleaning sponge brush for scrubbing a major surface (e.g., an upper surface) of the substrate held and rotated by the spin chuck, and a nozzle which supplies a cleaning chemical liquid to the substrate held and rotated by the spin chuck.

The cleaning process includes a process for removing foreign matter from the major surface of the semiconductor wafer by utilizing the etching action of the chemical liquid. Where SC1 (ammonia/hydrogen peroxide mixture liquid) is used as the cleaning chemical liquid, as described in PTL1, the major surface of the substrate is oxidized by the oxidizing action of a hydrogen peroxide component contained in the SC1 to be thereby formed with a silicon oxide film. Then, the silicon oxide film formed in the major surface of the substrate is removed together with the foreign matter adhering to the major surface by an ammonia component contained in the SC1. In addition, the major surface of the substrate is scrubbed with the cleaning brush, whereby the foreign matter is effectively removed from the major surface of the substrate.

CITATION LIST

Patent Literature

PTL1: JP2006-278957A

SUMMARY OF INVENTION

Technical Problem

Where the SC1 is used as the cleaning chemical liquid, however, the major surface of the substrate is oxidized with hydrogen peroxide water having a relatively weak oxidative power and, therefore, the oxide film is formed in a smaller amount in the major surface of the substrate. That is, the etching capability (foreign matter removing capability) of the SC1 is not so high. In this case, the cleaning efficiency is low, even if the major surface is scrubbed with the cleaning brush while the SC1 is supplied to the major surface. If a greater amount of foreign matter adheres to the major surface of the substrate to be cleaned, therefore, the cleaning of the major surface requires a longer period, problematically reducing the throughput.

To cope with this, the inventors of the present invention contemplate using a hydrofluoric acid/ozone solution containing ozone dissolved therein hydrofluoric acid as the cleaning chemical liquid.

Where a chemical liquid containing hydrofluoric acid having a hydrophobizing action is used as the cleaning chemical liquid, however, the major surface of the substrate is liable to be hydrophobized by the action of hydrofluoric acid contained in the chemical liquid. When the cleaning brush is brought into abutment against the major surface of the substrate thus hydrophobized, the foreign matter scrubbed off from the major surface by the cleaning brush is liable to adhere again to the major surface.

In view of the foregoing, it is an object of the present invention to provide a substrate processing method and a substrate processing apparatus which are capable of efficiently cleaning the major surface of the substrate with the use of the hydrofluoric acid/ozone solution while suppressing or preventing the re-adhesion of the foreign matter via the cleaning brush.

Solution to Problem

The present invention provides a substrate processing method, which includes: a substrate holding step of causing a substrate holding unit to hold a substrate; an ozone-containing hydrofluoric acid solution supplying step of supplying an ozone-containing hydrofluoric acid solution containing ozone dissolved therein a hydrofluoric acid solution to one major surface (one of opposite major surfaces) of the substrate held by the substrate holding unit; a brush-cleaning step of cleaning the one major surface of the substrate by bringing a cleaning brush into contact with the one major surface of the substrate after the ozone-containing hydrofluoric acid solution supplying step; and an ozone water supplying step of supplying ozone water to the one major surface of the substrate before start of the brush-cleaning step after the ozone-containing hydrofluoric acid solution supplying step or in the brush-cleaning step.

According to this method, the ozone water is supplied to the one major surface of the substrate before the start of the brush-cleaning step after the ozone-containing hydrofluoric acid solution supplying step or in the brush-cleaning step performed after the ozone-containing hydrofluoric acid solution supplying step.

In the ozone-containing hydrofluoric acid solution supplying step, the ozone-containing hydrofluoric acid solution is supplied to the one major surface of the substrate, and an oxide film is formed in the one major surface of the substrate by the oxidizing action of ozone contained in the ozone-containing hydrofluoric acid solution. Further, the oxide film formed in the one major surface of the substrate is peeled off (lifted off) from the one major surface by the oxide film etching action of hydrofluoric acid contained in the ozone-containing hydrofluoric acid solution. Thus, foreign matter (particles, impurities, peelings of the one major surface, and the like) adhering to or formed in the one major surface of the substrate can be removed, and flaws (chippings, dents, and the like) formed in the one major surface of the substrate can be removed. Since ozone having a strong oxidative power is used, the oxide film can be formed in a greater amount in the one major surface of the substrate. Thus, the greater amount of oxide film can be lifted off from the one major surface of the substrate. This makes it possible to efficiently remove the foreign matter and/or the flaws from the one major surface of the substrate.

In the brush-cleaning step to be performed after the ozone-containing hydrofluoric acid solution supplying step, the cleaning brush is brought into abutment against the one major surface of the substrate, whereby the removed foreign matter is scrubbed off by the cleaning brush. Thus, the peeled oxide film and the foreign matter are removed from the one major surface of the substrate.

In the ozone-containing hydrofluoric acid solution supplying step, on the other hand, the one major surface of the substrate is liable to be hydrophobized by hydrofluoric acid contained in the ozone-containing hydrofluoric acid solution. A hydrofluoric acid solution serves as a solvent for the ozone-containing hydrofluoric acid solution and, hence, has a lower hydrofluoric acid concentration. Further, ozone contained in the ozone-containing hydrofluoric acid solution has a hydrophilizing action. Therefore, the hydrophobization of the one major surface of the substrate by hydrofluoric acid contained in the ozone-containing hydrofluoric acid solution is suppressed, but the one major surface of the substrate is liable to at least partly exhibit hydrophobicity after the end of the ozone-containing hydrofluoric acid solution supplying step depending on the supply flow rate and the concentration of the ozone-containing hydrofluoric acid solution to be supplied to the one major surface of the substrate. Therefore, the foreign matter scrubbed off by the cleaning brush is liable to adhere again to the one major surface of the substrate, if the brush-cleaning step follows the ozone-containing hydrofluoric acid solution supplying step.

In the present invention, however, the ozone water is supplied to the one major surface of the substrate in the ozone water supplying step which is performed before the start of the brush-cleaning step or in parallel with the brush-cleaning step. Therefore, even if the substrate partly has a hydrophobic area after the end of the ozone-containing hydrofluoric acid solution supplying step, the hydrophobic area of the substrate can be hydrophilized by thereafter performing the ozone water supplying step.

Therefore, the brush-cleaning step can be performed with the entire one major surface of the substrate hydrophilized. Thus, the foreign matter is prevented from adhering again to the one major surface of the substrate via the cleaning brush.

According to one embodiment of the present invention, the ozone water supplying step includes the step of supplying ozone water to the one major surface of the substrate before the start of the brush-cleaning step after the ozone-containing hydrofluoric acid solution supplying step.

According to this method, the brush-cleaning step can be started with the entire one major surface of the substrate hydrophilized. Thus, the foreign matter is more reliably prevented from adhering again to the one major surface of the substrate.

In the substrate processing method, the ozone-containing hydrofluoric acid solution supplying step may include the step of spouting the ozone-containing hydrofluoric acid solution toward a center portion of the one major surface of the substrate held by the substrate holding unit. In this case, the substrate processing method may further include a substrate rotating step of rotating the substrate about a predetermined rotation axis in the ozone-containing hydrofluoric acid solution supplying step.

According to this method, the ozone-containing hydrofluoric acid solution supplied to the center portion of the one major surface of the substrate receives a centrifugal force generated by the rotation of the substrate to radially spread toward a peripheral portion of the one major surface of the substrate. Thus, the ozone-containing hydrofluoric acid solution can be distributed over the entire one major surface of the substrate. In other words, hydrofluoric acid and ozone can be distributed over the entire one major surface of the substrate.

The ozone water supplying step may include a center portion ozone water spouting step of spouting the ozone water toward the center portion of the one major surface of the substrate.

According to this method, the ozone water supplied to the center portion of the one major surface of the substrate receives a centrifugal force generated by the rotation of the substrate to radially spread toward the peripheral portion of the one major surface of the substrate. Thus, the ozone water can be distributed over the entire one major surface of the substrate. In other words, not only the center portion of the one major surface of the substrate but also the peripheral portion of the one major surface of the substrate can be hydrophilized.

The ozone water supplying step may include a peripheral portion ozone water spouting step of spouting the ozone water toward the peripheral portion of the one major surface of the substrate.

According to this method, the ozone water spouted toward the peripheral portion of the one major surface of the substrate is supplied to the entire peripheral portion of the one major surface of the substrate by the rotation of the substrate. Thus, the peripheral portion of the one major surface of the substrate can be efficiently hydrophilized, whereby the re-adhesion of the foreign matter to the one major surface of the substrate is suppressed or prevented in the brush-cleaning step.

The ozone water to be supplied to the one major surface of the substrate in the ozone water supplying step may have an ozone concentration of not lower than 50 ppm.

According to this method, the ozone concentration of the ozone water to be supplied in the ozone water supplying step is not lower than 50 ppm, so that the one major surface of the substrate can be properly hydrophilized. Thus, the brush-cleaning step can be performed with the entire one major surface of the substrate hydrophilized.

The substrate processing method may further include a protection fluid supplying step of supplying a protection fluid to the other major surface of the substrate so as to substantially prevent the ozone-containing hydrofluoric acid solution from flowing around to the other major surface of the substrate in the ozone-containing hydrofluoric acid solution supplying step.

According to this method, a device formation surface of the substrate can be protected by the protection fluid supplied to the device formation surface of the substrate. Therefore, a cleaning process can be performed on the one major surface of the substrate by using the ozone-containing hydrofluoric acid solution and the cleaning brush while protecting the other major surface of the substrate.

The substrate may include a semiconductor substrate. In this case, the other major surface of the substrate may be a device formation surface in which a device is formed.

Further, the one major surface of the substrate may be a non-device-formation surface in which no device is formed.

According to this method, the cleaning process can be performed on the non-device-formation surface of the substrate by using the ozone-containing hydrofluoric acid solution and the cleaning brush while protecting the device formation surface of the substrate. Thus, the foreign matter adhering to or formed in the non-device-formation surface and flaws formed in the non-device-formation surface can be removed.

The device formation surface may include a metal layer.

The protection fluid supplying step may include a protection gas supplying step of supplying a protection gas to the other major surface.

According to this method, the protection gas is supplied to the other major surface. Where the other major surface is the device formation surface (particularly, the device formation surface includes the metal layer, which is easily affected by treatment with water), the other major surface can be protected without supplying water to the other major surface.

In this case, if the supply flow rate of the ozone-containing hydrofluoric acid solution is high, the ozone-containing hydrofluoric acid solution is liable to flow around to the other major surface against the flow of the protection gas present on the other major surface of the substrate. Therefore, the supply flow rate of the ozone-containing hydrofluoric acid solution to be supplied in the ozone-containing hydrofluoric acid solution supplying step is limited.

With the supply flow rate of the ozone-containing hydrofluoric acid solution thus limited in the ozone-containing hydrofluoric acid solution supplying step, the amount of ozone contained in the ozone-containing hydrofluoric acid solution is reduced, so that the one major surface of the substrate is liable to at least partly exhibit hydrophobicity after the end of the ozone-containing hydrofluoric acid solution supplying step.

Particularly, where the ozone-containing hydrofluoric acid solution supplying step includes the step of spouting the ozone-containing hydrofluoric acid solution toward the center portion of the one major surface of the substrate and the substrate is rotated about the predetermined rotation axis in the ozone-containing hydrofluoric acid solution supplying step, ozone does not reach the peripheral portion of the one major surface of the substrate in the ozone-containing hydrofluoric acid solution supplying step. In this case, the peripheral portion of the one major surface exhibits hydrophobicity at the end of the ozone-containing hydrofluoric acid solution supplying step.

Even if the substrate has a hydrophobic area after the end of the ozone-containing hydrofluoric acid solution supplying step, however, the hydrophobic area is hydrophilized by thereafter performing the ozone water supplying step. Therefore, the brush-cleaning step can be performed with the entire one major surface of the substrate hydrophilized. Where the other major surface of the substrate is protected by supplying the protection gas, it is possible to prevent the foreign matter from adhering again to the one major surface of the substrate via the cleaning brush while preventing the ozone-containing hydrofluoric acid solution from flowing around to the other major surface of the substrate.

In the ozone-containing hydrofluoric acid solution supplying step, the ozone-containing hydrofluoric acid solution is preferably spouted at a spouting flow rate of not lower than 0.5 L/min and not higher than 1.0 L/min. In this case, the ozone-containing hydrofluoric acid solution can be prevented from flowing around to the other major surface of the substrate. The spouting flow rate is further preferably not higher than 0.8 L/min. In this case, the ozone-containing hydrofluoric acid solution can be more reliably prevented from flowing around to the other major surface of the substrate.

The substrate holding step may include the step of holding the substrate in a horizontal attitude, and the ozone-containing hydrofluoric acid solution supplying step may include the step of spouting the ozone-containing hydrofluoric acid solution to an upper surface of the substrate. The brush-cleaning step may include the step of cleaning the upper surface of the substrate.

According to this method, the upper surface of the substrate can be processed by using the ozone-containing hydrofluoric acid solution and the cleaning brush in the ozone-containing hydrofluoric acid solution supplying step.

Further, the one major surface of the substrate may include a silicon-containing surface which contains a silicon component.

According to this method, a silicon oxide film is formed in the one major surface of the substrate by the oxidizing action of ozone contained in the ozone-containing hydrofluoric acid solution. Further, the silicon oxide film formed in the one major surface of the substrate is peeled off from the one major surface by the oxide film etching action of hydrofluoric acid contained in the ozone-containing hydrofluoric acid solution. Thus, foreign matter (particles, impurities, peelings of the one major surface, and the like) adhering to or formed in the one major surface of the substrate can be removed, and flaws (chippings, dents, and the like) formed in the one major surface of the substrate can be removed. Since ozone having a strong oxidative power is used, the silicon oxide film can be formed in a greater amount in the one major surface of the substrate. Thus, the greater amount of oxide film can be lifted off from the one major surface of the substrate. This makes it possible to efficiently remove the foreign matter and/or the flaws from the one major surface of the substrate.

The one major surface of the substrate may include a titanium nitride-containing surface which contains titanium nitride.

The present invention further provides a substrate processing apparatus including: a substrate holding unit which holds a substrate; an ozone-containing hydrofluoric acid solution supplying unit for supplying an ozone-containing hydrofluoric acid solution containing ozone dissolved therein a hydrofluoric acid solution to one major surface of the substrate held by the substrate holding unit; an ozone water supplying unit for supplying ozone water to the one major surface of the substrate; a cleaning brush to be brought into contact with the one major surface for cleaning the one major surface; a cleaning brush driving unit for driving the cleaning brush; and a controller which controls the ozone-containing hydrofluoric acid solution supplying unit, the ozone water supplying unit and the cleaning brush driving unit to perform an ozone-containing hydrofluoric acid solution supplying step of supplying the ozone-containing hydrofluoric acid solution to the one major surface of the substrate, a brush-cleaning step of cleaning the one major surface of the substrate by bringing the cleaning brush into contact with the one major surface of the substrate after the ozone-containing hydrofluoric acid solution supplying step, and an ozone water supplying step of supplying the ozone water to the one major surface of the substrate before start of the brush-cleaning step after the ozone-containing hydrofluoric acid solution supplying step or in the brush-cleaning step.

With this arrangement, the ozone water is supplied to the one major surface of the substrate before the start of the brush-cleaning step after the ozone-containing hydrofluoric acid solution supplying step or in the brush-cleaning step performed after the ozone-containing hydrofluoric acid solution supplying step.

In the ozone-containing hydrofluoric acid solution supplying step, the ozone-containing hydrofluoric acid solution is supplied to the one major surface of the substrate, and an oxide film is formed in the one major surface of the substrate by the oxidizing action of ozone contained in the ozone-containing hydrofluoric acid solution. Further, the oxide film formed in the one major surface of the substrate is peeled off (lifted off) from the one major surface by the oxide film etching action of hydrofluoric acid contained in the ozone-containing hydrofluoric acid solution. Thus, foreign matter (particles, impurities, peelings of the one major surface, and the like) adhering to or formed in the one major surface of the substrate can be removed, and flaws (chippings, dents, and the like) formed in the one major surface of the substrate can be removed. Since ozone having a strong oxidative power is used, the oxide film can be formed in a greater amount in the one major surface of the substrate. Thus, the greater amount of oxide film can be lifted off from the one major surface of the substrate. This makes it possible to efficiently remove the foreign matter and/or the flaws from the one major surface of the substrate.

In the brush-cleaning step to be performed after the ozone-containing hydrofluoric acid solution supplying step, the cleaning brush is brought into contact with the one major surface of the substrate, whereby the removed foreign matter is scrubbed off by the cleaning brush. Thus, the peeled oxide film and the foreign matter can be removed from the one major surface of the substrate.

In the ozone-containing hydrofluoric acid solution supplying step, on the other hand, the one major surface of the substrate is liable to be hydrophobized by hydrofluoric acid contained in the ozone-containing hydrofluoric acid solution. A hydrofluoric acid solution serves as a solvent for the ozone-containing hydrofluoric acid solution and, hence, has a lower hydrofluoric acid concentration. Further, ozone contained in the ozone-containing hydrofluoric acid solution has a hydrophilizing action. Therefore, the hydrophobization of the one major surface of the substrate by hydrofluoric acid contained in the ozone-containing hydrofluoric acid solution is suppressed, but the one major surface of the substrate is liable to at least partly exhibit hydrophobicity after the end of the ozone-containing hydrofluoric acid solution supplying step depending on the supply flow rate and the concentration of the ozone-containing hydrofluoric acid solution to be supplied to the one major surface of the substrate. Therefore, the foreign matter scrubbed off by the cleaning brush is liable to adhere again to the one major surface of the substrate, if the brush-cleaning step follows the ozone-containing hydrofluoric acid solution supplying step.

In the present invention, however, the ozone water is supplied to the one major surface of the substrate in the ozone water supplying step which is performed before the start of the brush-cleaning step or in parallel with the brush-cleaning step. Thus, the entire one major surface of the substrate is hydrophilized.

Therefore, even if the substrate partly has a hydrophobic area after the end of the ozone-containing hydrofluoric acid solution supplying step, the hydrophobic area of the substrate can be hydrophilized by thereafter performing the ozone water supplying step.

Therefore, the brush-cleaning step can be performed with the entire one major surface of the substrate hydrophilized. Thus, the foreign matter is prevented from adhering again to the one major surface of the substrate via the cleaning brush.

The foregoing and other objects, features and effects of the present invention will become more apparent from the following description of embodiments with reference to the attached drawings.

BRIEF DESCRIPTION OF DRAWINGS

FIG. 10 is a block diagram for explaining the electrical configuration of major portions of the substrate processing apparatus.

FIG. 11 is a flow diagram for explaining an exemplary cleaning process to be performed by the substrate processing apparatus.

DESCRIPTION OF EMBODIMENTS

Figure 1:
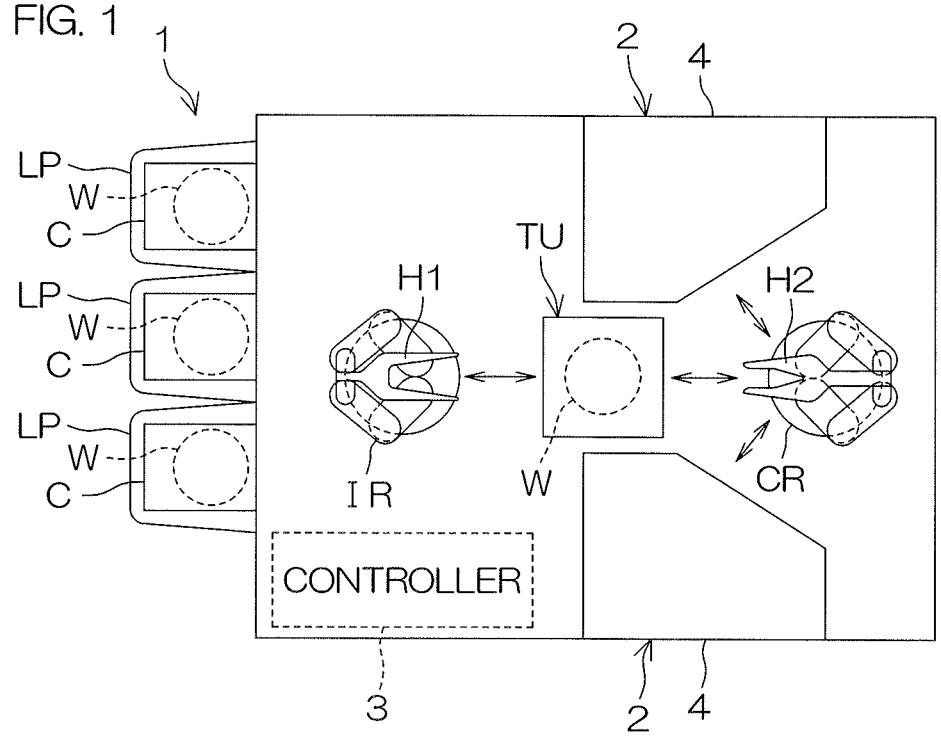
FIG. 1 is a schematic plan view for explaining the inside layout of a substrate processing apparatus according to one embodiment of the present invention.

FIG. 1 is a schematic plan view for explaining the inside layout of a substrate processing apparatus 1 according to one embodiment of the present invention.

The substrate processing apparatus 1 is an apparatus of a single substrate processing type adapted to treat a single disk-shaped substrate W of a semiconductor wafer (semiconductor substrate) with a processing liquid or a processing gas at a time. The substrate processing apparatus 1 includes load ports LP respectively retaining carriers C, an inversion unit TU which inverts a substrate W upside down, and a plurality of processing units 2 which each treat a substrate W. The load ports LP are horizontally spaced from the processing units 2. The inversion unit TU is disposed on a transport path along which the substrate W is transported between the load ports LP and the processing units 2.

As shown in FIG. 1, the substrate processing apparatus 1 further includes an indexer robot IR provided between the load ports LP and the inversion unit TU, a center robot CR provided between the inversion unit TU and the processing units 2, and a controller 3 which controls the operations of devices provided in the substrate processing apparatus 1 and the opening/closing of valves provided in the substrate processing apparatus 1. The indexer robot IR transports substrates W one by one from the carriers C respectively retained on the load ports LP to the inversion unit TU, and transports substrates W one by one from the inversion unit TU to the carriers C respectively retained on the loadports LP. Similarly, the center robot CR transports substrates W one by one from the inversion unit TU to the processing units 2, and transports substrates W one by one from the processing units 2 to the inversion unit TU. Further, the center robot CR transports the substrate W between the processing units 2.

The indexer robot IR includes a hand H1 which horizontally supports the substrate W. The indexer robot IR horizontally moves the hand H1. Further, the indexer robot IR moves the hand H1 up and down, and rotates the hand H1 about a vertical axis. Similarly, the center robot CR includes a hand H2 which horizontally supports the substrate W. The center robot CR horizontally moves the hand H2. Further, the center robot CR moves the hand H2 up and down, and rotates the hand H2 about a vertical axis.

The substrates Ware contained in the carriers C with their front surfaces Wa (device formation surfaces) facing up (in a face-up attitude). The controller 3 causes the indexer robot IR to transport a substrate W from one of the carriers C to the inversion unit TU with the front surface Wa facing up. Then, the controller 3 causes the inversion unit TU to invert the substrate W. Thus, a back surface Wb of the substrate W faces up. Thereafter, the controller 3 causes the center robot CR to transport the substrate W from the inversion unit TU to one of the processing units 2 with the back surface Wb facing up. The controller 3 causes the processing unit 2 to treat the back surface Wb of the substrate W.

After the back surface Wb of the substrate W is processed, the controller 3 causes the center robot CR to transport the substrate W from the processing unit 2 to the inversion unit TU with the back surface Wb facing up. Then, the controller 3 causes the inversion unit TU to invert the substrate W. Thus, the front surface Wa of the substrate W faces up. Thereafter, the controller 3 causes the indexer robot IR to transport the substrate W from the inversion unit TU to the carrier C with the front surface Wa facing up. Thus, the processed substrate W is contained in the carrier C. The controller 3 causes the indexer robot IR and the like to repeatedly perform this process sequence to treat the substrates W one by one.

Figure 2:
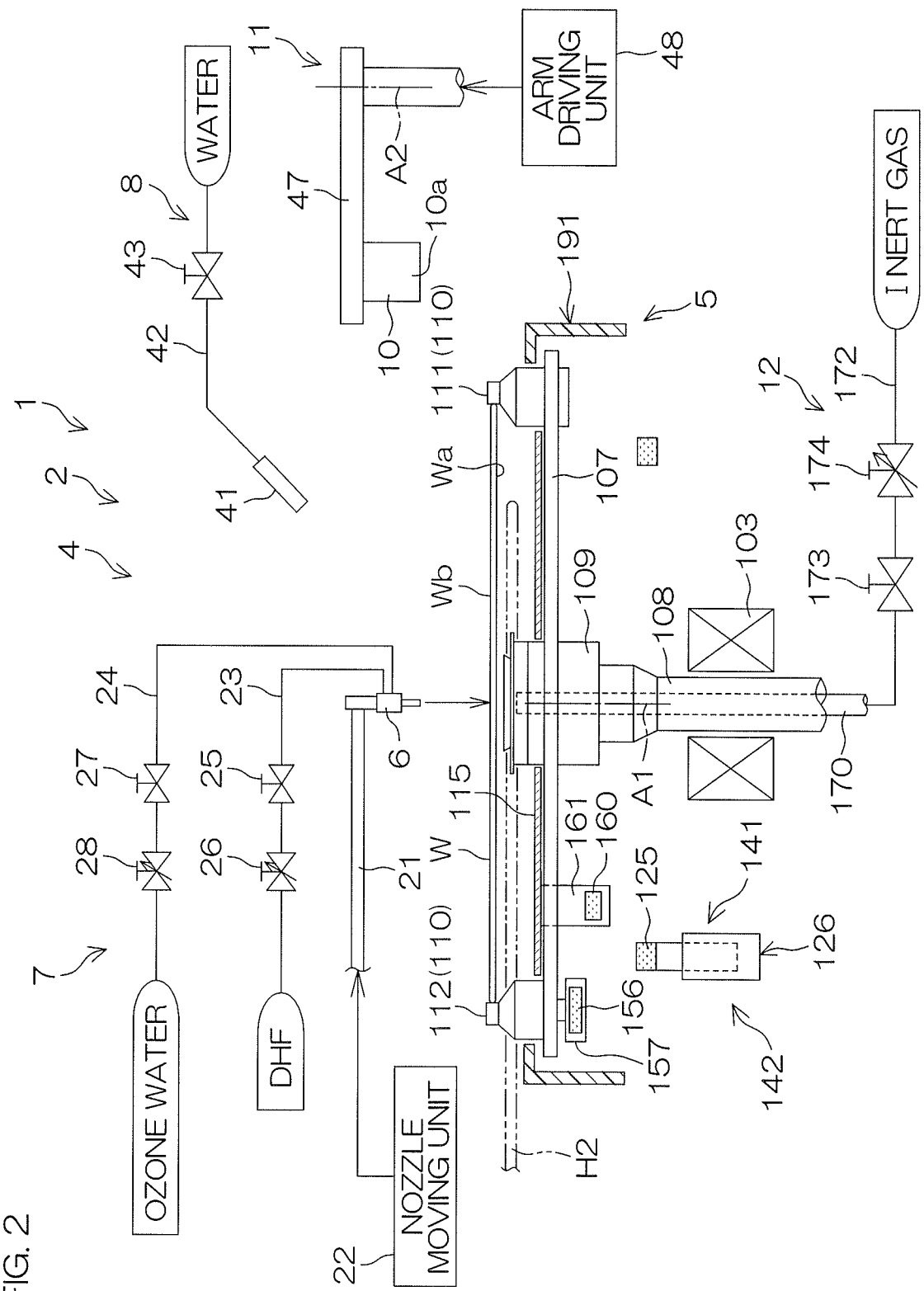
FIG. 2 is a schematic sectional view for explaining the construction of a processing unit provided in the substrate processing apparatus by way of example.

FIG. 2 is a schematic sectional view for explaining the construction of each of the processing units 2 provided in the substrate processing apparatus 1 by way of example.

The processing unit 2 includes a box-shaped processing chamber 4 having an inside space, a spin chuck (substrate holding unit) 5 which holds a single substrate W in a horizontal attitude in the processing chamber 4 and rotates the substrate W about a rotation axis A1 vertically extending through the center of the substrate W, an FOM nozzle 6 which selectively spouts (hereinafter referred to as FOM) and ozone water toward an upper surface (back surface (one major surface) Wb) of the substrate W held by the spin chuck 5, an FOM supplying device 7 which selectively supplies the FOM and the ozone water to the FOM nozzle 6, a water supplying unit 8 for supplying water to the upper surface of the substrate W held by the spin chuck 5, a cleaning brush 10 to be brought into contact with the upper surface of the substrate W for scrub-cleaning the upper surface, a cleaning brush driving unit 11 for driving the cleaning brush 10, a protection gas supplying unit 12 for supplying an inert gas (protection gas) to a lower surface (front surface (the other major surface) Wa) of the substrate W held by the spin chuck 5, and a tubular treatment cup (not shown) surrounding the spin chuck 5. The FOM nozzle 6 and the FOM supplying device 7 constitute an FOM supplying unit. In this embodiment, the FOM nozzle 6 and the FOM supplying device 7 also constitute an ozone water supplying unit. That is, the FOM supplying unit doubles as the ozone water supplying unit.

The processing chamber 4 includes a box-shaped partition wall (not shown), an FFU (fan/filter unit not shown) as an air supplying unit which supplies clean air from an upper portion of the partition wall to the inside of the partition wall (the inside of the processing chamber 4), and an evacuator (not shown) which expels gas from the processing chamber 4 from a lower portion of the partition wall. The FFU and the evacuator cooperatively form a downflow (downward stream) in the processing chamber 4.

The spin chuck 5 includes a turntable 107 which is rotatable about the vertical rotation axis A1. A rotation shaft 108 is connected to a lower surface of the turntable 107 at a rotation center of the turntable 107 via a boss 109. The rotation shaft 108 is a vertically extending hollow shaft, and is configured to receive a driving force from a rotative driving unit 103 to be thereby rotated about the rotation axis A1. The rotative driving unit 103 may be, for example, an electric motor employing the rotation shaft 108 as its driving shaft. The spin chuck 5 further includes a plurality of holder pins 110 (six holder pins 110 in this embodiment) disposed in circumferentially spaced relation on a peripheral portion of an upper surface of the turntable 107. The holder pins 110 are configured to horizontally hold the substrate W at a substrate holding height defined so as to be spaced a predetermined distance upward from the generally horizontal upper surface of the turntable 107.

The spin chuck 5 further includes a protection disk 115 disposed between the upper surface of the turntable 107 and the substrate holding height defined by the holder pins 110. The protection disk 115 is connected to the turntable 107 in a vertically movable manner, and is movable between a lower position close to the upper surface of the turntable 107 and an adjacent position located in slightly spaced adjacent relation to the lower surface of the substrate W held by the holder pins 110 above the lower position. The protection disk 115 is a disk-shaped member having a slightly greater diameter than the substrate W, and formed with cutaway portions in association with the holder pins 110 to avoid the holder pins 110.

The rotation shaft 108 is hollow, and an inert gas supply pipe 170 is inserted in the rotation shaft 108. A lower end of the inert gas supply pipe 170 is connected to an inert gas supply line 172 through which an inert gas is supplied as an exemplary protection gas from an inert gas supply source. Examples of the inert gas to be supplied through the inert gas supply line 172 include CDA (clean dehumidified air), nitrogen gas and other inert gases. An inert gas valve 173 and an inert gas flow rate control valve 174 are provided in the inert gas supply line 172. The inert gas valve 173 opens and closes the inert gas supply line 172. With the inert gas valve 173 open, the inert gas is fed into the inert gas supply pipe 170. The inert gas is supplied to a space defined between the protection disk 115 and the lower surface of the substrate W by an arrangement to be described later. Thus, the inert gas supply pipe 170, the inert gas supply line 172, the inert gas valve 173 and the like constitute the protection gas supplying unit 12 described above.

Figure 3:
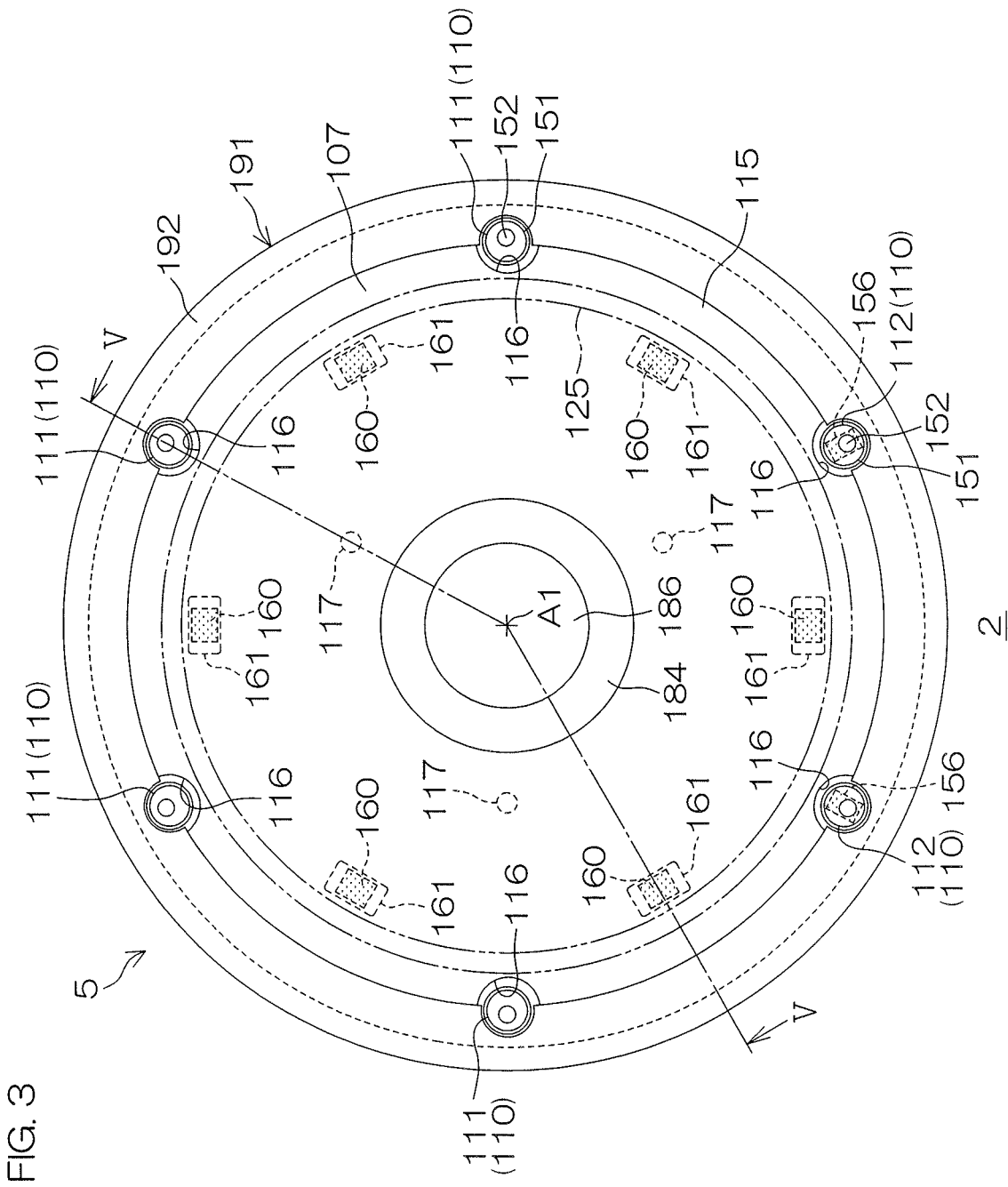
FIG. 3 is a plan view for explaining a more specific structure of a spin chuck provided in the substrate processing apparatus.
Figure 4:
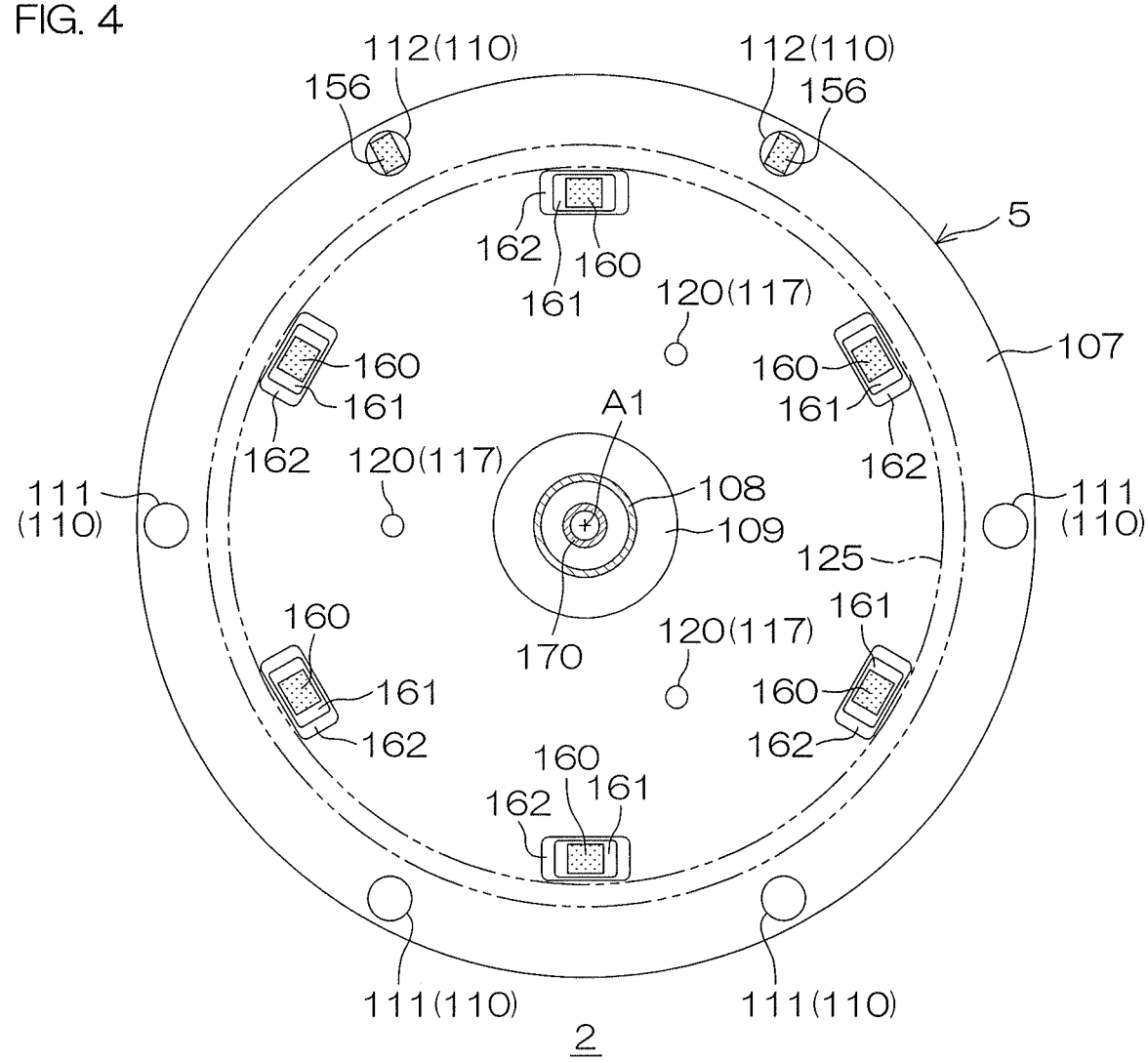
FIG. 4 is a bottom view of the structure of FIG. 3.
Figure 5:
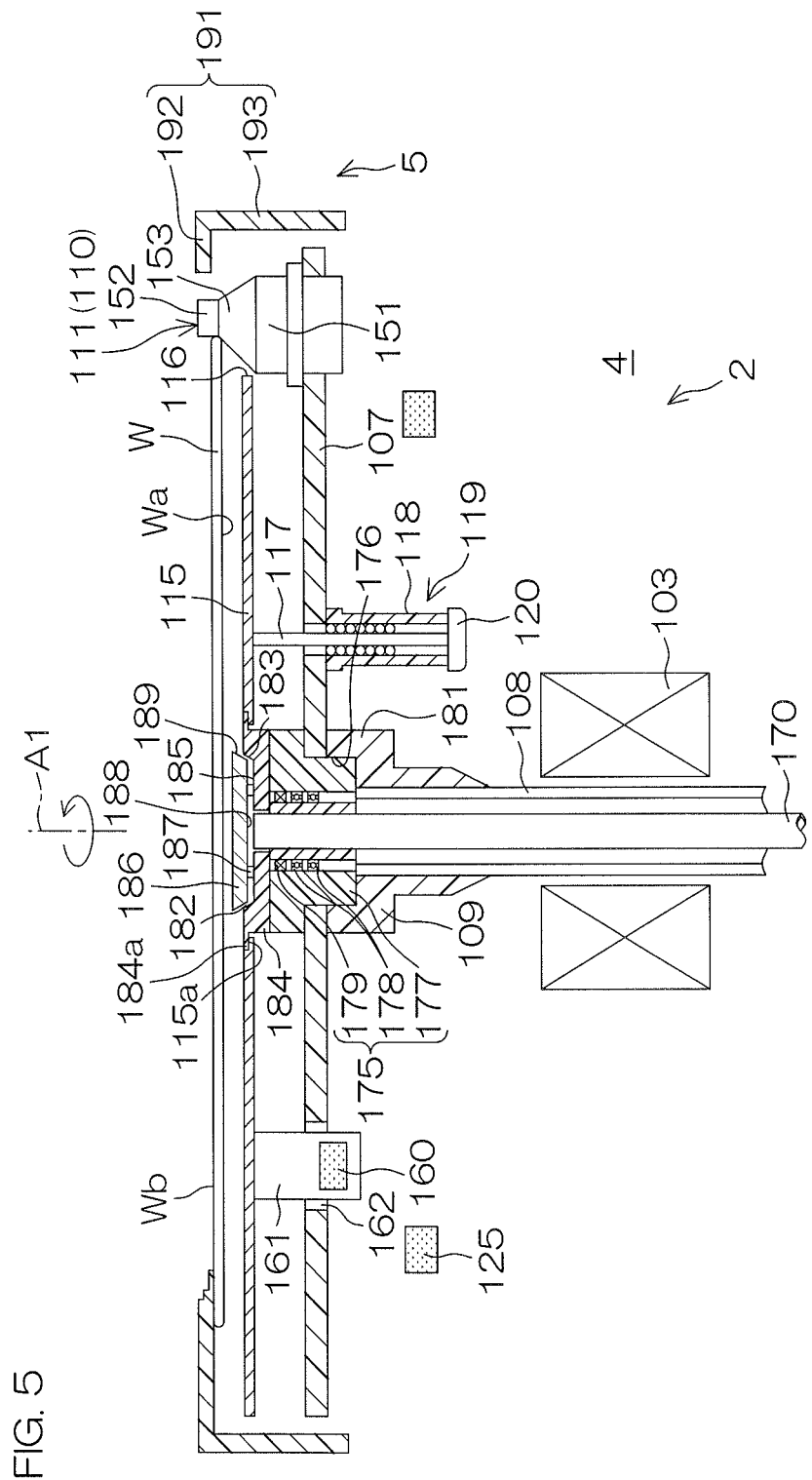
FIG. 5 is a sectional view taken along a sectional plane V-V in FIG. 3.
Figure 6:
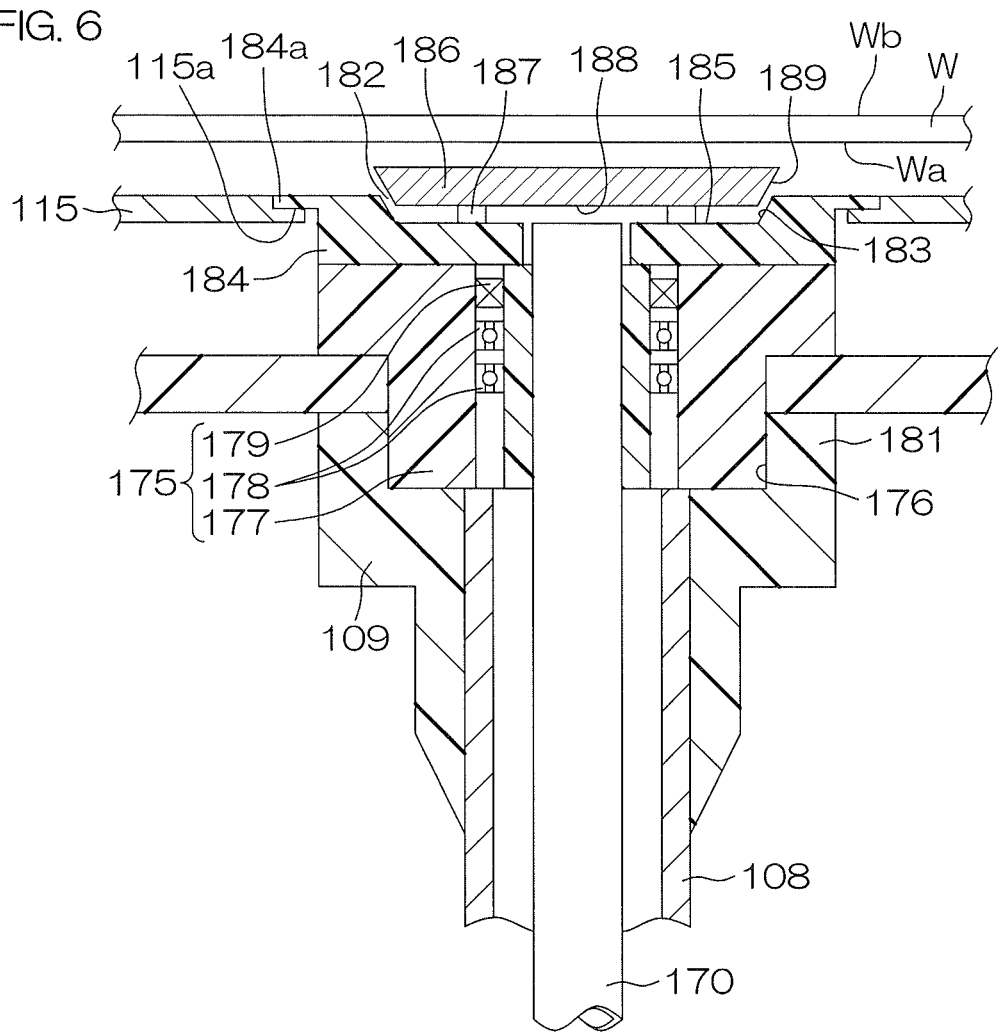
FIG. 6 is an enlarged sectional view showing a part of the structure of FIG. 5 on an enlarged scale.
Figure 7:
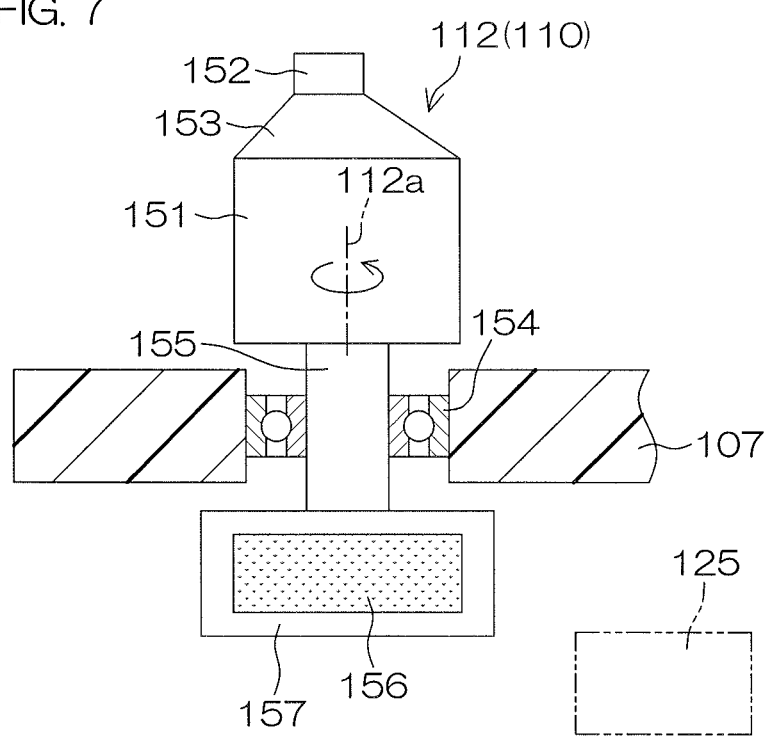
FIG. 7 is a sectional view showing the structure of a part of the spin chuck around a movable pin on an enlarged scale.
Figure 8:
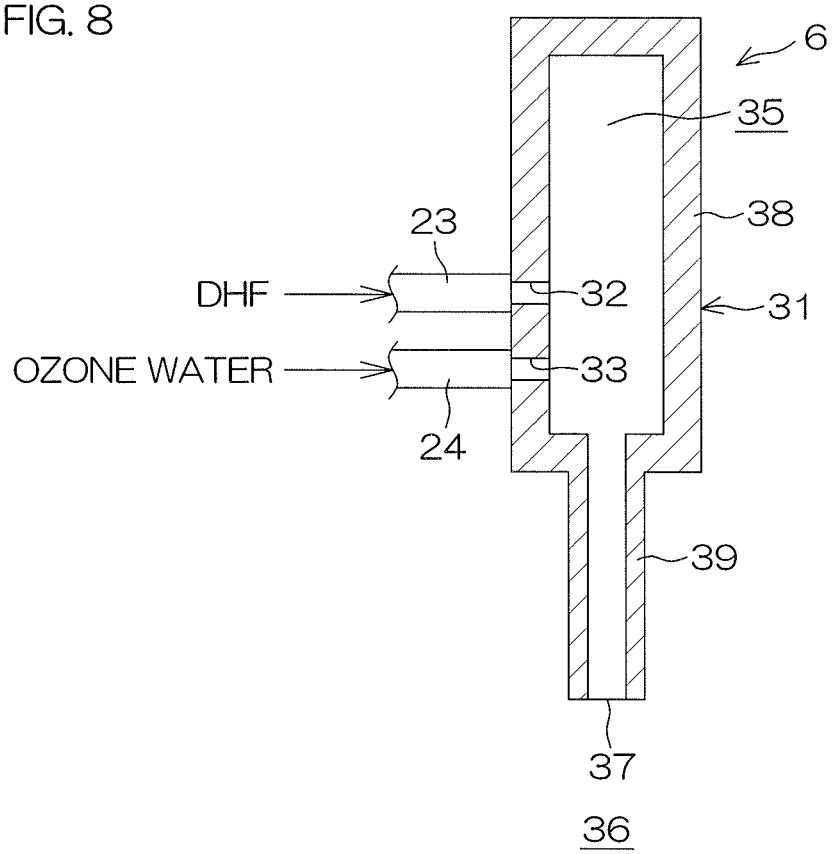
FIG. 8 is a schematic sectional view showing the structure of an FOM nozzle.
Figure 9:
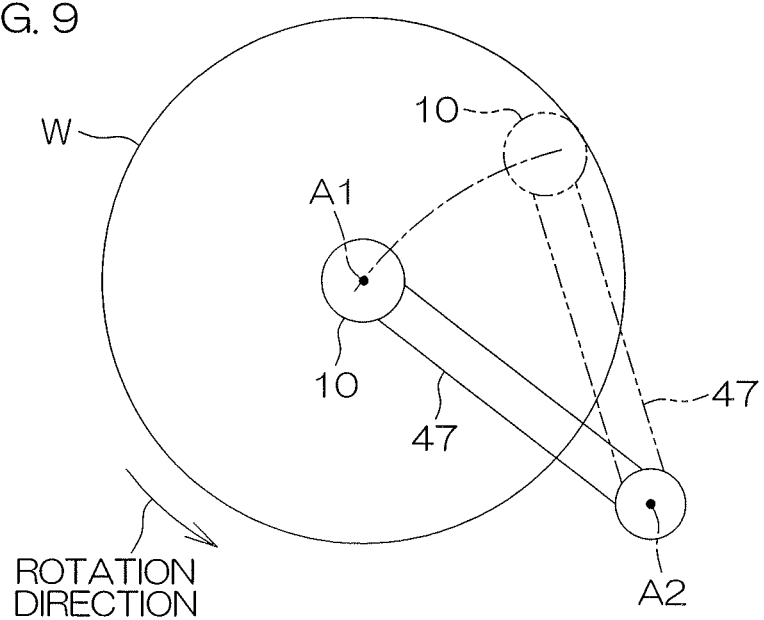
FIG. 9 is a schematic plan view for explaining the movement of a cleaning brush.

FIG. 3 is a plan view for explaining a more specific structure of the spin chuck 5 provided in the substrate processing apparatus 1. FIG. 4 is a bottom view of the structure of FIG. 3. FIG. 5 is a sectional view taken along a sectional plane V-V in FIG. 3. FIG. 6 is an enlarged sectional view showing a part of the structure of FIG. 5 on an enlarged scale. FIG. 7 is a sectional view showing the structure of a part of the spin chuck 5 around a movable pin 112 on an enlarged scale. FIG. 8 is a schematic sectional view showing the structure of the FOM nozzle 6. FIG. 9 is a schematic plan view for explaining the movement of the cleaning brush 10.

The turntable 107 has a disk shape extending in a horizontal plane, and is connected to the boss 109 connected to the rotation shaft 108. The plural holder pins 110 are circumferentially equidistantly arranged on the peripheral portion of the upper surface of the turntable 107. The holder pins 110 include immovable pins 111 which are immovable with respect to the turntable 107, and movable pins 112 which are movable with respect to the turntable 107. In this embodiment, adjacent two of the holder pins 110 serve as the movable pins 112. As shown in FIGS. 5 and 7, the holder pins 110 each include a lower shaft portion 151 connected to the turntable 107 and an upper shaft portion 152 provided integrally on an upper end of the lower shaft portion 151. The lower shaft portion 151 and the upper shaft portion 152 each have a cylindrical shape. The upper shaft portion 152 is eccentric to a center axis of the lower shaft portion 151. The upper end of the lower shaft portion 151 and a lower end of the upper shaft portion 152 are connected to each other by a taper surface 153 which extends downward from the upper shaft portion 152 to a peripheral surface of the lower shaft portion 151.

As schematically shown in FIG. 7, the movable pins 112 are each connected to the turntable 107 so that the lower shaft portion 151 is rotatable about a rotation axis 112a coinciding with the center axis of the lower shaft portion 151. More specifically, a support shaft 155 is provided at a lower end of the lower shaft portion 151, and is supported by the turntable 107 via a bearing 154. A magnet retaining member 157 retaining a pin driving permanent magnet 156 is connected to a lower end of the support shaft 155. The pin driving permanent magnet 156 is disposed, for example, with its magnetic pole direction extending perpendicularly to the rotation axis 112a of the movable pin 112.

The protection disk 115 is a generally disk-shaped member having substantially the same size as the substrate W. The protection disk 115 has cutaway portions 116 formed in an outer peripheral portion thereof in association with the holder pins 110 with edges of the cutaway portions 116 respectively spaced a predetermined distance from peripheral surfaces of the holder pins 110. The protection disk 115 has a round opening formed in a center region thereof in association with the boss 109.

As shown in FIGS. 3 and 5, guide shafts 117 each vertically extending parallel to the rotation axis A1 are connected to a lower surface of the protection disk 115 at positions more distant from the rotation axis A1 than the boss 109. In this embodiment, three guide shafts 117 are equidistantly arranged circumferentially of the protection disk 115. More specifically, the three guide shafts 117 are respectively disposed at angular positions associated with every other ones of the holder pins 110 as seen along the rotation axis A1. The guide shafts 117 are respectively connected to linear bearings 118 provided in corresponding positions of the turntable 107. The guide shafts 117 are respectively guided by the linear bearings 118 to be movable vertically parallel to the rotation axis A1. Thus, the guide shafts 117 and the linear bearings 118 constitute a guide unit 119 which guides the protection disk 115 vertically up and down parallel to the rotation axis A1.

The guide shafts 117 respectively extend through the linear bearings 118, and each include a flange 120 provided at a lower end thereof as projecting outward. With the flanges 120 in abutment against lower ends of the respective linear bearings 118, the upward movement of the guide shafts 117, i.e., the upward movement of the protection disk 115, is restricted. That is, the flanges 120 serve as a restriction member for restricting the upward movement of the protection disk.

Magnet retaining members 161 each retaining a protection disk permanent magnet 160 are fixed to the lower surface of the protection disk 115 at positions outwardly more distant from the rotation axis A1 than the guide shafts 117 and inwardly closer to the rotation axis A1 than the holder pins 110. In this embodiment, the protection disk permanent magnets 160 are respectively retained in the magnet retaining members 161 with their magnetic pole directions extending vertically. For example, the protection disk permanent magnets 160 may be each fixed in the magnet retaining member 161 with an S-pole thereof located on a lower side and with an N-pole thereof located on an upper side. In this embodiment, six magnet retaining members 161 are arranged in circumferentially equidistantly spaced relation. More specifically, the magnet retaining members 161 are respectively disposed at angular positions between adjacent ones of the holder pins 110 (intermediate between adjacent ones of the holder pins 110 in this embodiment) as seen along the rotation axis A1. Further, six angular sectors (six equiangular sectors in this embodiment) are defined by division of the protection disk by the six magnet retaining members 161 as seen along the rotation axis A1, and the three guide shafts 117 are respectively disposed in every other ones of the six angular sectors (at middle positions in every other ones of the six angular sectors in this embodiment).

As shown in FIG. 4, the turntable 107 has six through-holes 162 in association with the six magnet retaining members 161. The through-holes 162 are respectively configured so that the corresponding magnet retaining members 161 can be inserted through the through-holes 162 vertically parallel to the rotation axis A1. With the protection disk 115 located in the lower position, the magnet retaining members 161 are respectively inserted through the through-holes 162 to project downward from the lower surface of the turntable 107, so that the protection disk permanent magnets 160 are located below the lower surface of the turntable 107.

As shown in FIG. 2, a vertically movable permanent magnet 125 is disposed below the turntable 107. A magnet lift unit 126 which moves the vertically movable permanent magnet 125 vertically up and down is connected to the vertically movable permanent magnet 125. The magnet lift unit 126 includes, for example, a cylinder provided in a vertically extendable manner, and is supported by the cylinder.

The vertically movable permanent magnet 125 has an annular shape coaxial with the rotation axis A1, and is disposed in a flat plane (horizontal plane) perpendicular to the rotation axis A1. More specifically, the vertically movable permanent magnet 125 is located more distant from the rotation axis A1 than the protection disk permanent magnets 160 and closer to the rotation axis A1 than the pin driving permanent magnets 156. That is, the annular vertically movable permanent magnet 125 is positioned between the protection disk permanent magnets 160 and the pin driving permanent magnets 156 as seen in plan. Further, the vertically movable permanent magnet 125 is located at a lower level than the protection disk permanent magnets 160. In this embodiment, the vertically movable permanent magnet 125 has a magnetic pole direction extending horizontally, i.e., extending radially about the rotation axis of the turntable 107. Where the protection disk permanent magnets 160 each have an S-pole on the lower side, the vertically movable permanent magnet 125 is configured to have the same polarity, i.e., to have a ring-shaped S-pole, on a radially inward edge thereof about the rotation axis of the turntable.

Where the vertically movable permanent magnet 125 is located in an upper position defined such that a radially outward ring-shaped magnetic pole is horizontally opposed to the pin driving permanent magnets 156 (see FIG. 12B), the movable pins 112 are driven to and retained at holding positions by magnetic forces acting between the vertically movable permanent magnet 125 and the pin driving permanent magnets 156.

The upper shaft portions 152 of the movable pins 112 are each eccentric to the rotation axis 112a (see FIG. 7). Therefore, the upper shaft portions 152 are each shifted between a release position more distant from the rotation axis A1 and a holding position closer to the rotation axis A1 by the rotation of the lower shaft portions 151. The upper shaft portions 152 of the movable pins 112 are each biased toward the release position by a resilient pressing force of a resilient pressing member such as a spring (not shown). Therefore, the movable pins 112 are each located at the release position more distant from the rotation axis A1, when the pin driving permanent magnets 156 each receive no attractive magnetic force from the vertically movable permanent magnet 125.

The pin driving permanent magnets 156 are each located so that the upper shaft portion 152 is movable to the holding position closer to the rotation axis A1 when the pin driving permanent magnets 156 each receive an attractive magnetic force from the vertically movable permanent magnet 125 (a magnetic force greater than the resilient pressing force generated by the resilient pressing member). Since the vertically movable permanent magnet 125 has an annular shape coaxial with the rotation axis A1, the attractive magnetic forces are generated between the vertically movable permanent magnet 125 and the pin driving permanent magnets 156 irrespective of the rotational positions of the movable pins 112 about the rotation axis A1, i.e., even during the rotation of the turntable 107. Thus, the movable pins 112 are retained at the holding positions at which the movable pins 112 hold the substrate W.

When the vertically movable permanent magnet 125 is located in the upper position (see FIG. 12B), repulsive magnetic forces act between the vertically movable permanent magnet 125 and the protection disk permanent magnets 160 and, therefore, the protection disk permanent magnets 160 each receive an upward external force. Thus, the protection disk 115 receives upward forces from the magnet retaining members 161 retaining the protection disk permanent magnets 160 to be thereby retained in a processing position adjacent to the lower surface of the substrate W.

Where the vertically movable permanent magnet 125 is located in a lower position (see FIG. 12A) spaced downward from the upper position (see FIG. 12B), smaller repulsive magnetic forces act between the vertically movable permanent magnet 125 and the protection disk permanent magnets 160. Therefore, the protection disk 115 is retained in the lower position closer to the upper surface of the turntable 107 by its gravity. Since the vertically movable permanent magnet 125 is not opposed to the pin driving permanent magnets 156, external forces for biasing the movable pins 112 toward the holding positions do not act on the movable pins 112.

When the vertically movable permanent magnet 125 is located in the lower position, therefore, the protection disk 115 is located in the lower position closer to the upper surface of the turntable 107, and the movable pins 112 are retained at the release positions. In this state, the center robot CR which loads the substrate W into the spin chuck 5 and unloads the substrate W from the spin chuck 5 can insert its hand H2 into the space defined between the protection disk 115 and the lower surface of the substrate W.

The protection disk permanent magnets 160, the vertically movable permanent magnet 125 and the magnet lift unit 126 constitute a magnetic levitation unit 141 which levitates the protection disk 115 from the surface of the turntable 107 upward to the processing position by the repulsive forces generated between the permanent magnets 125 and 160. Further, the pin driving permanent magnets 156, the vertically movable permanent magnet 125 and the magnet lift unit 126 constitute a magnetic driving unit 142 which retains the movable pins 112 at the holding positions by the magnetic forces between the permanent magnets 125 and 156.

That is, the magnetic levitation unit 141 and the magnetic driving unit 142 share the vertically movable permanent magnet 125 and the magnet lift unit 126. When the vertically movable permanent magnet 125 is located in the upper position, the protection disk 115 is retained in the adjacent position by the magnetic repulsive forces generated between the vertically movable permanent magnet 125 and the protection disk permanent magnets 160, and the movable pins 112 are retained at the holding positions by the magnetic attractive forces generated between the vertically movable permanent magnet 125 and the pin driving permanent magnets 156.

As illustrated on an enlarged scale in FIG. 6, the boss 109 connected to the upper end of the rotation shaft 108 retains a bearing unit 175 which supports an upper end portion of the inert gas supply pipe 170. The bearing unit 175 includes a spacer 177 fitted and fixed in a recess 176 formed in the boss 109, bearings 178 disposed between the spacer 177 and the inert gas supply pipe 170, and a magnetic fluid bearing 179 disposed between the spacer 177 and the inert gas supply pipe 170 above the bearings 178.

As shown in FIG. 5, the boss 109 unitarily includes a flange 181 projecting outward in a horizontal plane, and the turntable 107 is connected to the flange 181. Further, the spacer 177 is fixed to the flange 181 to hold an inner peripheral edge portion of the turntable 107 between the spacer 177 and the flange 181. A cover 184 is connected to the spacer 177. The cover 184 has a generally disk shape. The cover 184 has a center opening through which the upper end of the inert gas supply pipe 170 is exposed, and a recess 185 provided in an upper surface thereof with the center opening formed in a bottom of the recess 185. The recess 185 has a horizontal bottom surface, and an inclined surface 183 having an inverted partial conical shape and extending from a peripheral edge of the bottom surface obliquely outward upward. A stream regulating member 186 is connected to the bottom surface of the recess 185. The stream regulating member 186 has a plurality of legs 187 (e.g., four legs 187) discretely provided in circumferentially spaced relation about the rotation axis A1, and a bottom surface 188 spaced from the bottom surface of the recess 185 by the legs 187. The stream regulating member 186 has an inclined surface 189 having an inverted partial conical shape and extending from a peripheral edge of the bottom surface 188 obliquely outward upward.

As shown in FIGS. 5 and 6, the cover 184 has a flange 184a projecting outward from an outer peripheral edge of the upper surface thereof. The flange 184a is configured to be fitted with a step 115a formed along an inner peripheral edge of the protection disk 115. That is, when the protection disk 115 is located in the adjacent position adjacent to the lower surface of the substrate W, the flange 184a is fitted with the step 115a, so that the upper surface of the cover 184 and the upper surface of the protection disk 115 are flush with each other to define a flat inert gas flow passage.

With this arrangement, the inert gas flowing out from the upper end of the inert gas supply pipe 170 flows into a space defined by the bottom surface 188 of the stream regulating member 186 in the recess 185 of the cover 184. Then, the inert gas is ejected radially away from the rotation axis A1 through a radial flow passage 182 defined by the inclined surface 183 of the recess 185 and the inclined surface 189 of the stream regulating member 186. The inert gas forms an inert gas stream in the space defined between the protection disk 115 and the lower surface of the substrate W held by the holder pins 110, and is ejected from the space radially outward about the rotation axis of the substrate W.

As shown in FIG. 5, an outer peripheral portion of the upper surface of the protection disk 115 and a peripheral edge of the protection disk 115 are protected by an annular cover 191. The cover 191 includes an annular plate portion 192 projecting radially inward from an outer periphery of an upper surface thereof, and a hollow cylindrical portion 193 extending downward from a peripheral edge of the annular plate portion 192. The outer periphery of the annular plate portion 192 is located outward of the peripheral edge of the turntable 107. The annular plate portion 192 and the hollow cylindrical portion 193 are unitarily formed of, for example, a chemically resistant resin material. The annular plate portion 192 has cutaway portions 194 formed in an inner peripheral portion thereof in association with the holder pins 110 to avoid the holder pins 110. The cutaway portions 194 are formed in the annular plate portion 192 with edges thereof respectively spaced a predetermined distance from the peripheral surfaces of the holder pins 110.

The annular plate portion 192 of the cover 191 has throttling portions 190 (see FIG. 13) provided on an upper surface thereof for narrowing the inert gas flow passage around the outer periphery of the substrate W held by the holder pins 110. These throttling portions 190 increase the flow rate of the inert gas ejected outward from the space defined between the cover 191 and the lower surface (front surface Wa) of the substrate W, thereby reliably preventing or suppressing intrusion of the processing liquid (FOM) to the lower surface (front surface Wa) of the substrate W from the upper surface (back surface Wb) of the substrate W.

As shown in FIG. 2, the FOM nozzle 6 is, for example, a straight nozzle which selectively spouts the FOM and the ozone water in a continuous flow state, and is connected to a distal end of a horizontally extending nozzle arm 21 in a vertical attitude such that the processing liquid is spouted vertically to the upper surface of the substrate W. The FOM nozzle 6 may be retained by the nozzle arm 21 in an inward attitude such that the FOM or the ozone water is spouted in a spouting direction tilted with respect to the upper surface of the substrate W to be applied to a position inward of the spout of the FOM nozzle 6 (toward the rotation axis A1). Alternatively, the FOM nozzle 6 may be retained by the nozzle arm 21 in an outward attitude such that the FOM or the ozone water is spouted in a spouting direction tilted with respect to the upper surface of the substrate W to be applied to a position outward of the spout of the FOM nozzle 6 (away from the rotation axis A1). A nozzle moving unit 22 is connected to the nozzle arm 21.

The nozzle moving unit 22 pivots the nozzle arm 21 about a pivot axis (not shown) to horizontally move the FOM nozzle 6 along a path extending through a center portion of the upper surface of the substrate W as seen in plan. The nozzle moving unit 22 horizontally moves the FOM nozzle 6 between a processing position defined such that the FOM or the ozone water spouted from the FOM nozzle 6 is applied to the upper surface of the substrate W and a home position defined such that the FOM nozzle 6 is located in the vicinity of the spin chuck 5 as seen in plan. Further, the nozzle moving unit 22 horizontally moves the FOM nozzle 6 between a center position defined such that the FOM or the ozone water spouted from the FOM nozzle 6 is applied to the center portion of the upper surface of the substrate W and a peripheral position defined such that the FOM or the ozone water spouted from the FOM nozzle 6 is applied to a peripheral portion of the upper surface of the substrate W. The processing position includes the center position and the peripheral position.

The FOM supplying device 7 is connected to the FOM nozzle 6, and includes a hydrofluoric acid pipe 23 to which dilute hydrofluoric acid is supplied from a dilute hydrofluoric acid supply source (not shown), and an ozone water pipe 24 to which the ozone water is supplied from an ozone water supply source (not shown) which includes, for example, an ozone generator.

A hydrofluoric acid valve 25 for opening and closing the hydrofluoric acid pipe 23 and a hydrofluoric acid flow rate control valve 26 are provided in the hydrofluoric acid pipe 23. The hydrofluoric acid valve is controlled to be opened and closed by the controller 3. Though not shown, the hydrofluoric acid flow rate control valve 26 includes a valve body including a valve seat provided therein, a valve member which opens and closes the valve seat, and an actuator which moves the valve member between an open position and a closed position. Other flow rate control valves each have the same construction.

An ozone water valve 27 for opening and closing the ozone water pipe 24 and an ozone water flow rate control valve 28 which controls the opening degree of the ozone water pipe 24 to control the flow rate of the ozone water flowing through the ozone water pipe 24 are provided in the ozone water pipe 24. The ozone water is supplied to the FOM nozzle 6 through the ozone water pipe 24.

As shown in FIG. 8, the FOM nozzle 6 includes a generally hollow cylindrical casing 31. The FOM nozzle 6 is attached to the nozzle arm 21 (see FIG. 2) in a vertical attitude with a center axis of the casing extending vertically. The casing 31 includes a first cylindrical portion 38 and a second cylindrical portion 39 having a smaller diameter than the first cylindrical portion 38 and having a hollow cylindrical shape coaxial with the first cylindrical portion 38. Since the second cylindrical portion 39 has a smaller diameter than the first cylindrical portion 38, a flow passage defined inside the second cylindrical portion 39 has a smaller sectional area than a flow passage of the first cylindrical portion 38. The first cylindrical portion 38 and the second cylindrical portion 39 each have an inner wall extending vertically.

A hydrofluoric acid inlet port 32 for introducing the dilute hydrofluoric acid into the casing 31 and an ozone water inlet port 33 for introducing the ozone water into the casing 31 are provided in a lower portion of the first cylindrical portion 38 of the casing 31. The positional relation of the hydrofluoric acid inlet port 32 and the ozone water inlet port 33 may be such that the hydrofluoric acid inlet port 32 is located above the ozone water inlet port 33, as shown in FIG. 8, or vice versa.

When the hydrofluoric acid valve 25 (see FIG. 2) and the ozone water valve 27 (see FIG. 2) are opened, the dilute hydrofluoric acid from the hydrofluoric acid pipe 23 is supplied into a mixing chamber 35 from the hydrofluoric acid inlet port 32, and the ozone water from the ozone water pipe 24 is supplied into the mixing chamber 35 from the ozone water inlet port 33. The dilute hydrofluoric acid and the ozone water supplied into the mixing chamber 35 are sufficiently mixed together in a lower portion of the mixing chamber 35 (with stirring). The dilute hydrofluoric acid and the ozone water are thus homogeneously mixed together to prepare the hydrofluoric acid/ozone mixture liquid (FOM). The second cylindrical portion 39 of the casing 31 has an outlet port 37 provided at a distal end (lower end) thereof for spouting the prepared FOM toward an external space 36. The FOM prepared in the mixing chamber 35 flows through the inside of the second cylindrical portion 39 to be spouted from the outlet port 37. With this simple construction, the FOM can be spouted from the FOM nozzle 6.

Since the hydrofluoric acid solution and the ozone water are mixed together inside the FOM nozzle 6, the ozone-containing hydrofluoric acid solution can be spouted from the FOM nozzle 6 immediately after the mixing (immediately after the preparation thereof). Ozone dissolved in the hydrofluoric acid solution starts decomposition immediately after the dissolution. Since the FOM can be spouted from the FOM nozzle 6 immediately after the mixing (immediately after the preparation thereof), the FOM can be supplied to the substrate W in a state substantially free from the decomposition of ozone.

As shown in FIG. 2, the water supplying unit 8 includes a water nozzle 41. The water nozzle 41 is, for example, a straight nozzle which spouts the liquid in a continuous flow state, and is fixedly disposed above the spin chuck 5 with its spout directed toward the center portion of the upper surface of the substrate W. The water nozzle 41 is connected to a water pipe 42 to which water is supplied from a water supply source. A water valve 43 for switching on and off the supply of water from the water nozzle 41 is provided in the water pipe 42. When the water valve 43 is opened, the water supplied from the water pipe 42 to the water nozzle 41 in the continuous flow state is spouted from an outlet port provided at a lower end of the water nozzle 41. When the water valve 43 is closed, the supply of the water from the water pipe 42 to the water nozzle 41 is stopped. The water is, for example, deionized water (DIW). The water is not limited to the DIW, but may be carbonated water, electrolytic ion water, hydrogen water, ozone water or a hydrochloric acid aqueous solution having a dilute concentration (e.g., about 10 ppm to about 100 ppm).

The water nozzle 41 is not necessarily required to be disposed in fixed relation with respect to the spin chuck 5, but may be, for example, a so-called scan nozzle which is attached to an arm pivotal in a horizontal plane above the spin chuck 5 so that a water application position can be scanned over the upper surface of the substrate W by pivoting the arm.

The cleaning brush 10 is a cylindrical scrub member of a sponge made of, for example, PVA (polyvinyl alcohol). The cleaning brush 10 has a flat cleaning surface 10a on its lower surface. The cleaning surface 10a functions as a contact surface to be brought into contact with the upper surface of the substrate W.

The cleaning brush driving unit 11 includes a pivot arm 47 which retains the cleaning brush 10 at its distal end, and an arm driving unit 48 for driving the pivot arm 47. The arm driving unit 48 is configured to pivot the pivot arm 47 about a vertically extending pivot axis A2, and to move the pivot arm 47 vertically up and down. With this arrangement, the cleaning brush 10 can be horizontally moved between a position above the substrate Wanda home position defined on a lateral side of the spin chuck 5 when the substrate W is held and rotated by the spin chuck 5.

Further, as shown in FIG. 9, a cleaning brush press-contact position at which the cleaning surface 10a of the cleaning brush 10 is kept in press contact with the upper surface (back surface Wb) of the substrate W can be moved (scanned) radially of the substrate W between the center portion of the substrate W (a position indicated by a solid line in FIG. 9) and the peripheral portion of the substrate W (a position indicated by a two-dot-and-dash line in FIG. 9).

In the scrub-cleaning, the water (e.g., purified water (deionized water)) may be supplied to the back surface Wb of the substrate W from the water nozzle 41, whereby foreign matter can be easily removed from the back surface Wb of the substrate W and foreign matter scrubbed off by the cleaning brush 10 can be expelled from the substrate W.

FIG. 10 is a block diagram for explaining the electrical configuration of major portions of the substrate processing apparatus 1.

The controller 3 controls the operations of the rotative driving unit 103, the nozzle moving unit 22, the arm driving unit 48, the magnet lift unit 126 and the like according to a predetermined program. Further, the controller 3 controls the opening/closing operations and the like of the hydrofluoric acid valve 25, the hydrofluoric acid flow rate control valve 26, the ozone water valve 27, the ozone water flow rate control valve 28, the water valve 43, the inert gas valve 173, the inert gas flow rate control valve 174 and the like.

Figure 12A:
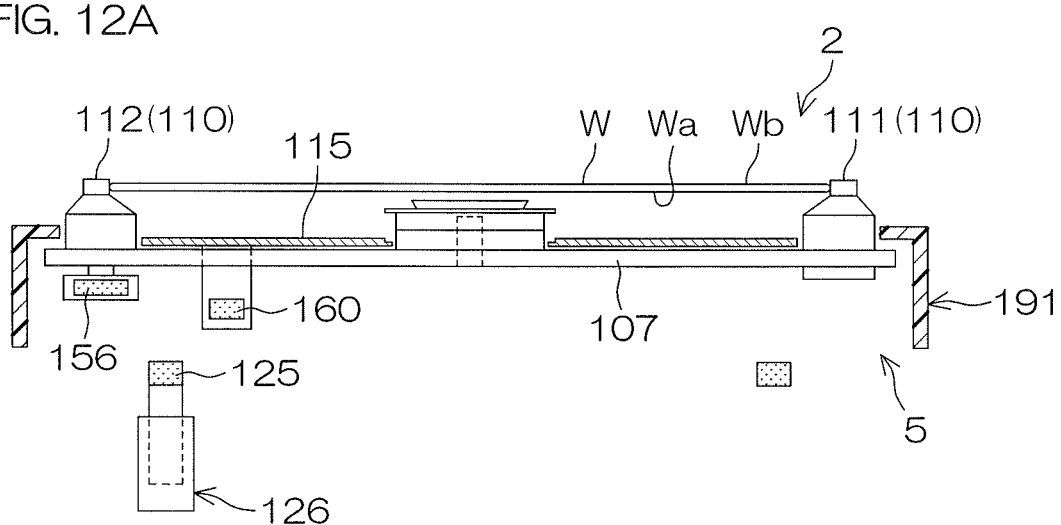
FIGS. 12A and 12B are schematic diagrams for explaining exemplary process steps of the cleaning process.

FIG. 11 is a flow diagram for explaining an exemplary cleaning process to be performed by the processing unit 2. FIGS. 12A to 12F are schematic diagrams for explaining the exemplary cleaning process. FIG. 13 is a sectional view showing the flows of the FOM and the inert gas on the peripheral portion of the substrate W.

In the following description, reference will be made to FIGS. 1, 2 to 7, and 11. Reference will also be made to FIGS. 12A to 12F and 13 as required. Where the substrate W has a diameter of 300 mm, for example, the peripheral portion of the back surface Wb of the substrate W is defined as an annular portion of the back surface Wb having a width of about 10 mm along the peripheral edge of the substrate W.

The substrate W to be processed by the processing unit 2 is a substrate W processed by a pre-processing apparatus such as an annealing apparatus or a film forming apparatus (hereinafter sometimes referred to as "uncleaned substrate"). An example of the substrate W is a round silicon substrate. The substrate W may be a large substrate (e.g., a round substrate having an outer diameter of 300 mm). The processing unit 2 is a cleaning unit of a single substrate processing type for cleaning the back surface Wb (one major surface, non-device-formation surface) opposite from the front surface Wa (the other major surface, device formation surface) of the substrate W.

The back surface Wb of the substrate W to be loaded into the processing unit 2 is a bare silicon surface of a silicon substrate W. The silicon surface to be processed may contain at least one of polysilicon and amorphous silicon. In this embodiment, the back surface Wb of the substrate W has chuck marks formed by the pre-processing apparatus (e.g., chuck marks formed by an electrostatic chuck). The chuck marks include flaws such as chippings and dents formed in the back surface Wb of the substrate W, partial peelings of the back surface Wb, and the like. The chuck marks are formed in the entire back surface Wb of the substrate W. The processing unit 2 removes the chuck marks formed in the back surface Wb of the substrate W by the cleaning process. The cleaning process is not intended to perfectly remove the chuck marks from the back surface Wb of the substrate W, but is intended to remove most of the chuck marks (roughly remove the chuck marks) from the back surface Wb of the substrate W.

In this embodiment, the front surface Wa of the substrate W is formed with a metal layer M. The metal layer M contains at least one of Cu, TiN, W and Al. Since the front surface Wa of the substrate W is formed with the metal layer M, water cannot be supplied to the front surface Wa of the substrate W. This makes it impossible to protect the front surface Wa of the substrate W with a protection liquid such as water (to cover the front surface Wa of the substrate W with a cover rinse liquid) during a chemical liquid process in which the back surface Wb of the substrate W is processed with a chemical liquid (e.g., in an ozone-containing hydrofluoric acid solution supplying step (hereinafter referred to as "FOM supplying step") T6).

A carrier C containing an uncleaned substrate W is transported into the substrate processing apparatus 1 from the pre-processing apparatus, and placed on a load port LP. The substrate W is contained in the carrier C with its front surface Wa facing up. The controller 3 causes the indexer robot IR to transport the substrate W from the carrier C to the inversion unit TU with the front surface Wa of the substrate W facing up. Then, the controller 3 causes the inversion unit TU to invert the transported substrate W (T1: substrate inverting step). Thus, the back surface Wb of the substrate W faces up. Thereafter, the controller 3 causes the center robot CR to take out the substrate W from the inversion unit TU by the hand H2, and then load the substrate W into the processing unit 2 with the back surface Wb of the substrate W facing up (Step T2). The uncleaned substrate W loaded into the processing unit 2 is transferred to the spin chuck 5. Thus, as shown in FIG. 12A, the substrate W is placed on the spin chuck 5 with its front surface Wa facing down and with its back surface Wb facing up.

Prior to the loading of the substrate W, the FOM nozzle 6 is retracted to the home position defined on the lateral side of the spin chuck 5. The cleaning brush 10 is also retracted to the home position defined on the lateral side of the spin chuck 5. Further, the vertically movable permanent magnet 125 is located in the lower position. Since the vertically movable permanent magnet 125 is significantly spaced downwardly away from the turntable 107, smaller repulsive magnetic forces act between the vertically movable permanent magnet 125 and the protection disk permanent magnets 160. Therefore, the protection disk 115 is located in the lower position adjacent to the upper surface of the turntable 107. Thus, a space sufficient to receive the hand H2 of the center robot CR is provided between the upper surface of the protection disk 115 and the substrate holding height of the holder pins 110. Since the vertically movable permanent magnet 125 is significantly spaced downwardly away from the turntable 107, the pin driving permanent magnets 156 receive no attractive magnetic forces from the vertically movable permanent magnet 125. Thus, the movable pins 112 are each retained at the release position.

The hand H2 of the center robot CR holds the substrate W at a level higher than the upper ends of the holder pins 110 and, in this state, transports the substrate W to above the spin chuck 5. Thereafter, the hand H2 of the center robot CR is moved down toward the upper surface of the turntable 107. In this movement, the substrate W is transferred from the hand H2 of the center robot CR to the holder pins 110. The hand H2 of the center robot CR is moved down to the space defined between the front surface Wa (lower surface) of the substrate W and the protection disk 115, and then retracted between the holder pins 110 to the lateral side of the spin chuck 5.

Subsequently, the controller 3 controls the magnet lift unit 126 to move the vertically movable permanent magnet 125 up to the upper position (Step T3). During the upward movement of the vertically movable permanent magnet 125 to the upper position, the vertically movable permanent magnet 125 approaches the protection disk permanent magnets 160 from the lower side, whereby distances between the permanent magnets 125 and 160 are reduced and the repulsive magnetic forces acting between the permanent magnets 125 and 160 are correspondingly increased. The repulsive magnetic forces levitate the protection disk 115 from the upper surface of the turntable 107 toward the substrate W. Before the vertically movable permanent magnet 125 reaches the upper position, the protection disk 115 is moved to the adjacent position located in slightly spaced adjacent relation to the front surface Wa (lower surface) of the substrate W, and the flanges 120 provided at the lower ends of the guide shafts 117 are respectively brought into abutment against the linear bearings 118. Thus, the protection disk 115 is retained in the adjacent position, and the movable pins 112 are each driven from the release position to the holding position and retained at the holding position. In this manner, the substrate W is clamped by the immovable pins 111 and the movable pins 112 (substrate holding step).

Figure 12B:
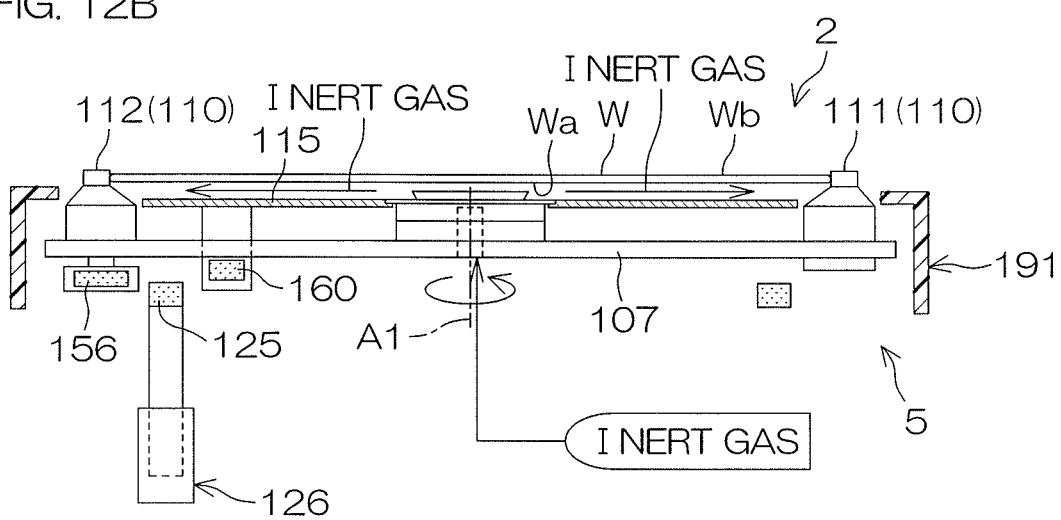
Figure 13:
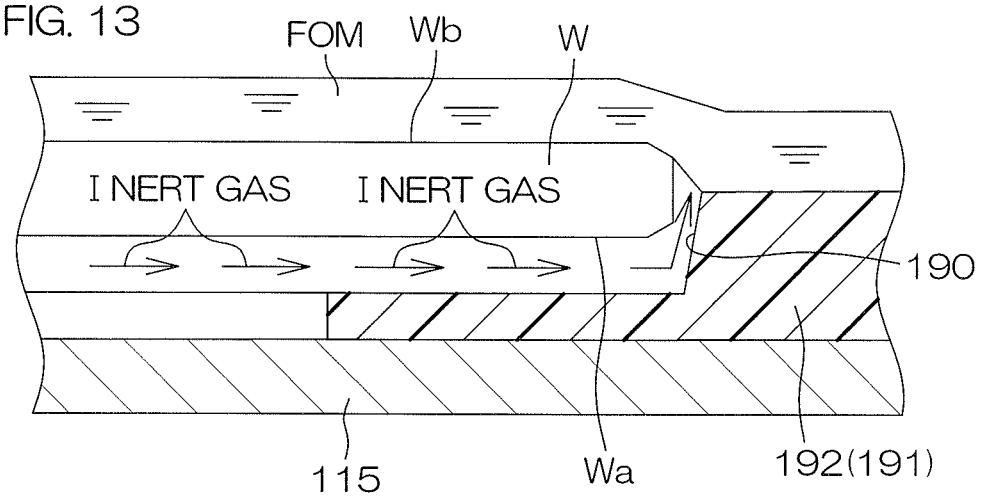
FIG. 13 is a sectional view showing the flows of FOM and an inert gas on a peripheral portion of a substrate.

In this state, the controller 3 opens the inert gas valve 173 to start supplying the inert gas as shown in FIG. 12B (T4: protection gas supplying step). The supplied inert gas is spouted from the upper end of the inert gas supply pipe 170, and is ejected radially about the rotation axis A1 toward the narrow space between the protection disk 115 located in the adjacent position and the front surface Wa (lower surface) of the substrate W by the function of the stream regulating member 186 and the like. As shown in FIG. 13, the inert gas is further accelerated by orifices defined between the outer periphery of the substrate W and the throttling portions 190 formed on the annular plate portion 192 of the cover 191 disposed around the protection disk 115 to thereby form high-speed ejection streams flowing laterally of the substrate W. In this embodiment, the spouting flow rate of the inert gas to be spouted from the upper end of the inert gas supply pipe 170 is set at a higher level (e.g., 180 L/min).

Figure 12C:
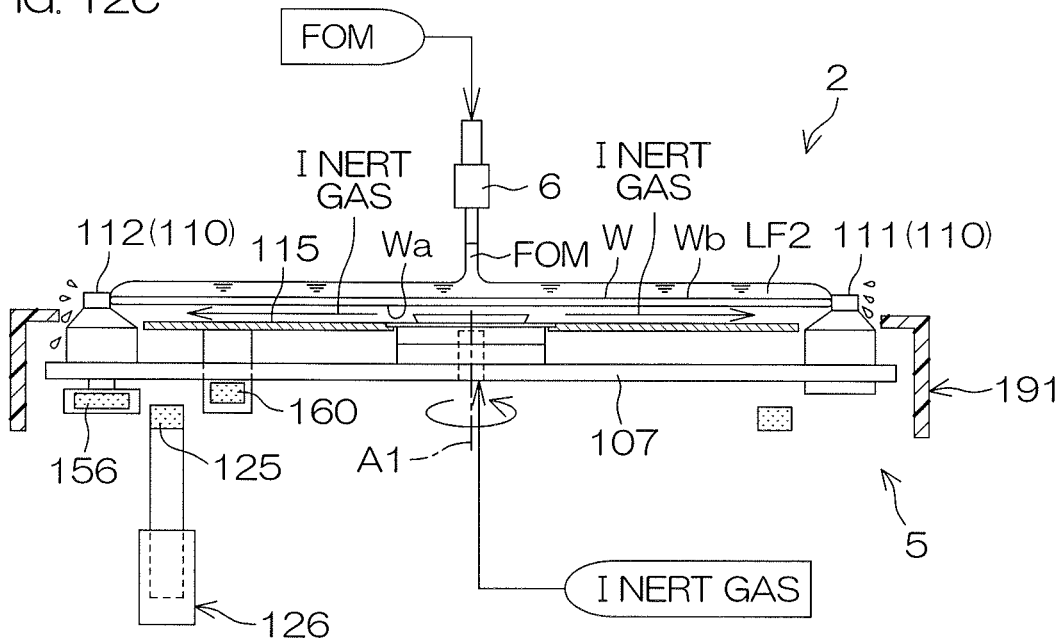
FIGS. 12C and 12D are schematic diagrams for explaining process steps following the step of FIG. 12B.

Thereafter, the controller 3 controls the rotative driving unit 103 to start rotating the turntable 107, whereby the substrate W is rotated about the rotation axis A1 as shown in FIG. 12C (Step T5). The rotation speed of the substrate W is increased to a predetermined liquid processing speed (in a range of 300 to 1500 rpm, e.g., 500 rpm), and maintained at the liquid processing speed.

When the rotation speed of the substrate W reaches the liquid processing speed, the controller 3 performs an FOM supplying step (Step T6) of supplying the FOM to the back surface Wb of the substrate W. In the FOM supplying step (T6), the controller 3 controls the nozzle moving unit 22 to move the FOM nozzle 6 from the home position to the center position. Thus, the FOM nozzle 6 is located above the center portion of the substrate W. After the FOM nozzle 6 is located above the substrate W, the controller 3 simultaneously opens the hydrofluoric acid valve 25 and the ozone water valve 27. Thus, the dilute hydrofluoric acid flowing through the hydrofluoric acid pipe 23 is supplied to the FOM nozzle 6, and the ozone water flowing through the ozone water pipe 24 is supplied to the FOM nozzle 6. Then, the dilute hydrofluoric acid and the ozone water are mixed together in the casing of the FOM nozzle 6, whereby the FOM is prepared. As shown in FIG. 12C, the FOM is spouted from the outlet port of the FOM nozzle 6 to be thereby applied to the center portion of the back surface Wb of the substrate W. The FOM supplied to the center portion of the back surface Wb of the substrate W receives a centrifugal force generated by the rotation of the substrate W to spread radially toward the peripheral portion of the back surface Wb of the substrate W. Thus, the FOM can be distributed over the entire back surface Wb of the substrate W. In other words, hydrofluoric acid and ozone can be distributed over the entire back surface Wb of the substrate W. As a result, as shown in FIG. 12C, a liquid film LF2 of the FOM covering the entire back surface Wb of the substrate W is formed on the substrate W.

When the FOM is supplied to the back surface Wb of the substrate W, a silicon oxide film is formed in the back surface Wb of the substrate (silicon substrate) W by the oxidizing action of ozone contained in the FOM. Further, the silicon oxide film formed in the back surface Wb of the substrate W is peeled off (lifted off) from the back surface Wb by the oxide film etching action of hydrofluoric acid contained in the FOM. Thus, flaws (chippings, dents, and the like) formed in the back surface Wb of the substrate W are removed. In addition, foreign matter (particles, impurities, peelings of the back surface Wb of the substrate W, and the like) is removed from the back surface Wb of the substrate W. That is, the back surface Wb of the substrate W can be cleaned.

Where the FOM is used as the cleaning chemical liquid, the silicon oxide film can be formed in a greater amount in the back surface Wb of the substrate W as compared with a case in which SC1 is used as the cleaning chemical liquid. Therefore, the FOM has a higher etching capability (foreign matter removing capability). In addition, the ozone water contained in the FOM reduces the running costs as compared with hydrogen peroxide contained in the SC1. This reduces the costs for the cleaning process.

In the FOM supplying step (T6), the front surface Wa of the substrate W is protected with the inert gas (protection gas). Since the spouting flow rate of the inert gas to be spouted from the inert gas supply pipe 170 is set at a higher level, as described above, the FOM supplied at a lower flow rate from the FOM nozzle 6 to the back surface Wb of the substrate W is prevented from flowing around to the front surface Wa of the substrate W.

If the FOM is supplied at a higher supply flow rate in the FOM supplying step (T6), however, the FOM is liable to flow around to the front surface Wa of the substrate W against the gas flow formed on the front surface Wa of the substrate W. Therefore, the supply flow rate of the FOM to be supplied in the FOM supplying step (T6) is limited.

The supply flow rate of the FOM to be supplied in the FOM supplying step (T6) is preferably not lower than 0.5 L/min and not higher than 1.0 L/min. In this case, the FOM is prevented from flowing around to the front surface Wa of the substrate W. The supply flow rate is further preferably not higher than 0.8 L/min. In this case, the FOM is more reliably prevented from flowing around to the front surface Wa of the substrate W.

The FOM to be spouted from the FOM nozzle 6 preferably has a hydrofluoric acid concentration of not lower than 0.093 wt. % and not higher than 0.221 wt. %.

The FOM to be spouted from the FOM nozzle 6 has an ozone concentration of not lower than 22.5 ppm and not higher than 67.2 ppm, more preferably not lower than 22.5 ppm and not higher than 42.0 ppm. An FOM having an ozone concentration of higher than 42.0 ppm contains a greater number of bubbles and, therefore, is not suitable for the substrate processing. If the ozone concentration of the FOM is higher than 42.0 ppm, ozone is liable to penetrate through the wall of the ozone water pipe 24 (made of PFA) to appear on the ozone water pipe 24. As the ozone concentration increases, the toxicity of ozone is increased. Therefore, the FOM having an ozone concentration of higher than 42.0 ppm when being spouted is not preferred in terms of safety.

Where the back surface Wb of the substrate W is processed with a chemical liquid containing hydrofluoric acid having a hydrophobizing action, the back surface Wb of the substrate W is liable to be hydrophobized by the action of hydrofluoric acid contained in the chemical liquid. More specifically, the decomposition of ozone dissolved in the hydrofluoric acid solution starts immediately after the dissolution of ozone. Therefore, where the FOM is spouted toward the center portion of the back surface Wb of the substrate W during the rotation of the substrate W, there is a possibility that ozone does not reach the peripheral portion of the back surface Wb of the substrate W in the FOM supplying step (T6) depending on the spouting flow rate and/or the ozone concentration of the FOM. In this case, the peripheral portion of the back surface Wb of the substrate W is liable to be hydrophobized by hydrofluoric acid reaching the peripheral portion of the back surface Wb of the substrate W. Particularly, where the FOM to be supplied to the back surface Wb of the substrate W has a higher hydrofluoric acid concentration, only hydrofluoric acid reaches the peripheral portion of the back surface Wb of the substrate W and, therefore, the peripheral portion of the back surface Wb of the substrate W is more liable to exhibit hydrophobicity.

In this embodiment, particularly, the front surface Wa of the substrate W is protected with the protection gas, but not with the protection liquid. Therefore, the supply flow rate of the FOM to be supplied in the FOM supplying step (T6) is limited (has an upper limit) so as to prevent the FOM from flowing around to the front surface Wa of the substrate W. With the supply flow rate of the FOM thus limited, the peripheral portion of the back surface Wb of the substrate W is more liable to exhibit hydrophobicity at the end of the FOM supplying step (T6).

If the peripheral portion of the back surface Wb of the substrate W is scrubbed with the cleaning brush 10 in a hydrophobic state, the foreign matter is liable to adhere again to the peripheral portion of the back surface Wb of the substrate W via the cleaning brush 10. Therefore, a so-called peripheral mode occurs in which particles are annularly present on the peripheral portion of the back surface Wb of the substrate W after the cleaning process.

After a lapse of a predetermined FOM processing period from the start of the spouting of the FOM, the FOM supplying step (T6) ends. After the end of the FOM supplying step (T6), an ozone water supplying step (Step T7) of supplying the ozone water to the substrate W is performed.

Figure 12D:
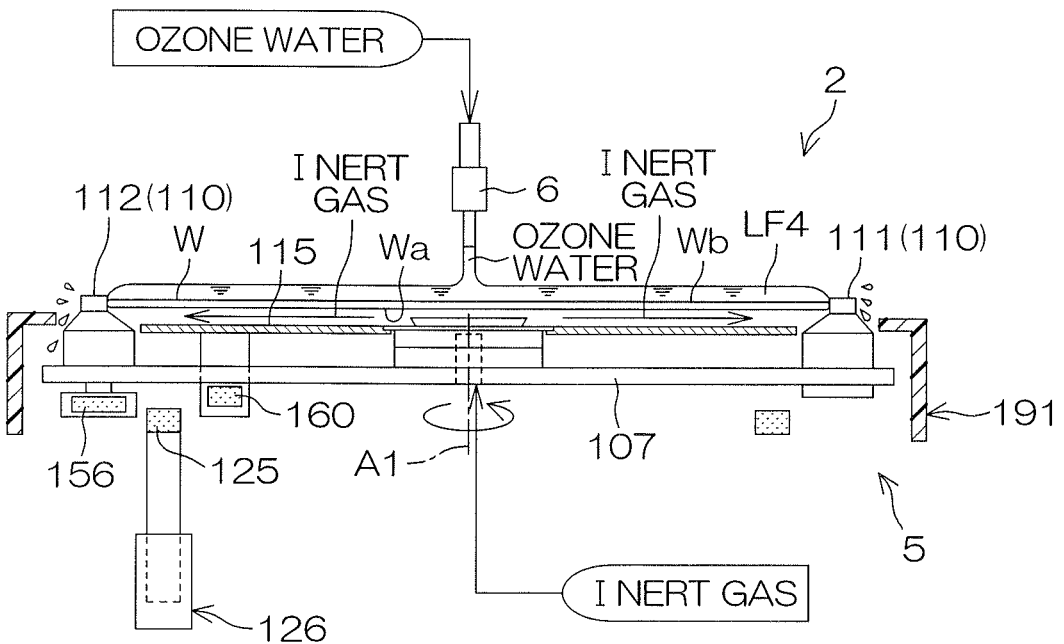

More specifically, the controller 3 closes only the hydrofluoric acid valve 25 with the ozone water valve 27 kept open while the FOM nozzle 6 is located above the center portion of the back surface Wb of the substrate W. Thus, only the ozone water is supplied to the FOM nozzle 6. As shown in FIG. 12D, the ozone water supplied to the FOM nozzle 6 flows through the casing of the FOM nozzle 6 to be spouted from the outlet port of the FOM nozzle 6. The ozone water is applied to the center portion of the back surface Wb of the substrate W being rotated at the liquid processing speed. That is, the processing liquid spouted from the FOM nozzle 6 to the center portion of the back surface Wb of the substrate W is changed from the FOM to the ozone water (center portion ozone water spouting step).

The ozone water applied to the center portion of the back surface Wb of the substrate W flows outward toward the peripheral edge of the substrate W on the substrate W. The FOM on the substrate W is replaced with the ozone water and, finally, the entire back surface Wb of the substrate W is covered with a liquid film LF4 of the ozone water. Thus, the ozone water is supplied to the entire back surface Wb of the substrate W, which is thereby hydrophilized. Even if the peripheral portion of the back surface Wb of the substrate W is hydrophobized in the FOM supplying step (T6), the hydrophobized area (peripheral portion) can be hydrophilized.

The ozone water to be supplied to the back surface Wb of the substrate W in the ozone water supplying step (T7) has an ozone concentration of not lower than 50 ppm. Therefore, the entire back surface Wb of the substrate W can be properly hydrophilized. Further, the spouting flow rate of the ozone water to be spouted in the ozone water supplying step (T7) is preferably as high as possible, but is desirably not higher than 0.8 L/min in order to prevent the ozone water from flowing around to the front surface Wa.

As described above, the peripheral portion of the back surface Wb of the substrate W is liable to be hydrophobic at the end of the FOM supplying step (T6). However, the hydrophobic peripheral portion of the back surface Wb of the substrate W can be hydrophilized by entirely hydrophilizing the back surface Wb of the substrate W.

After a lapse of a predetermined ozone water supply period from the start of the spouting of the ozone water from the FOM nozzle 6, the controller 3 closes the ozone water valve 27 to stop spouting the ozone water from the FOM nozzle 6. The ozone water supply period is preferably not shorter than 5 seconds. In this case, the entire back surface Wb of the substrate W (including the peripheral portion) can be properly hydrophilized. The controller 3 moves the FOM nozzle 6 from the center position to the home position. Thus, the FOM nozzle 6 is retracted from above the substrate W.

After the end of the ozone water supplying step (T7), the supply of water as a rinse liquid to the back surface Wb of the substrate W is started (Step T8).

Figure 12E:
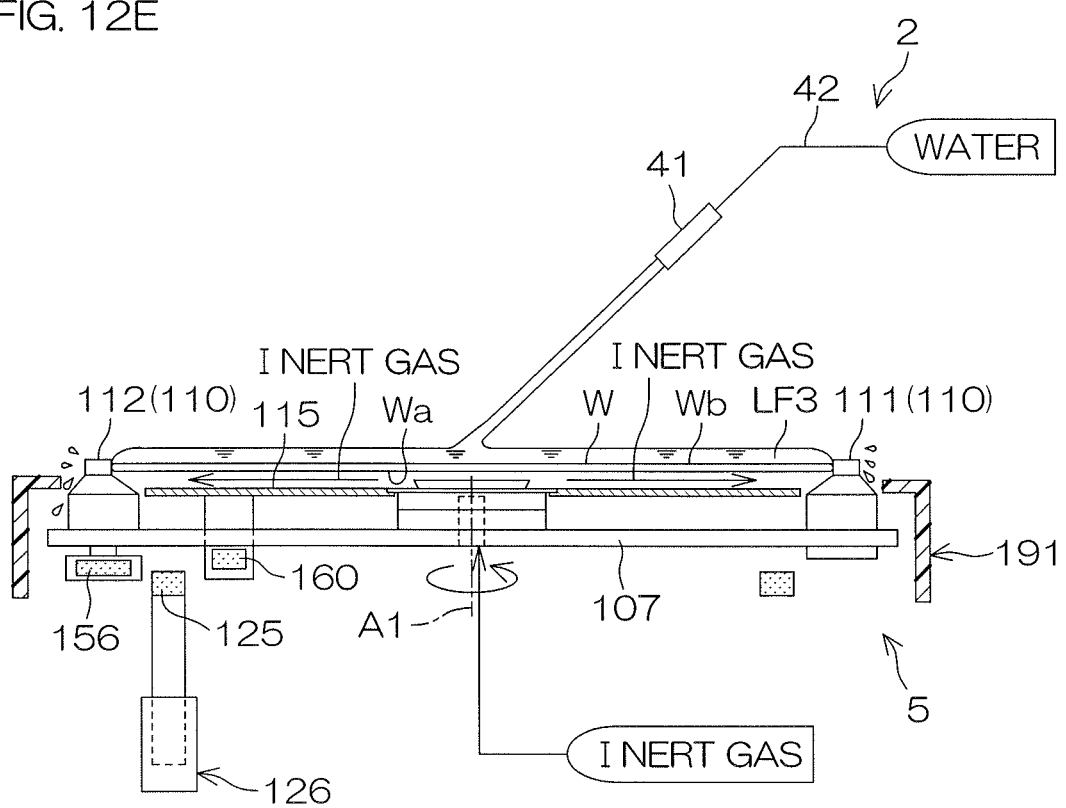
FIGS. 12E and 12F are schematic diagrams for explaining process steps following the step of FIG. 12D.

More specifically, as shown in FIG. 12E, the controller 3 opens the water valve 43 to spout water from the water nozzle 41 toward the center portion of the back surface Wb of the substrate W. The water spouted from the water nozzle 41 is applied to the center portion of the back surface Wb of the substrate W covered with the ozone water. The water applied to the center portion of the back surface Wb of the substrate W receives a centrifugal force generated by the rotation of the substrate W to flow toward the peripheral portion of the substrate W on the back surface Wb of the substrate W, thereby spreading over the entire back surface Wb of the substrate W. Therefore, the ozone water on the substrate W is forced to flow outward by the applied water to be expelled around the substrate W. Thus, the liquid film LF4 of the ozone water on the substrate W is replaced with a liquid film LF3 of the water covering the entire back surface Wb of the substrate W.

Figure 12F:
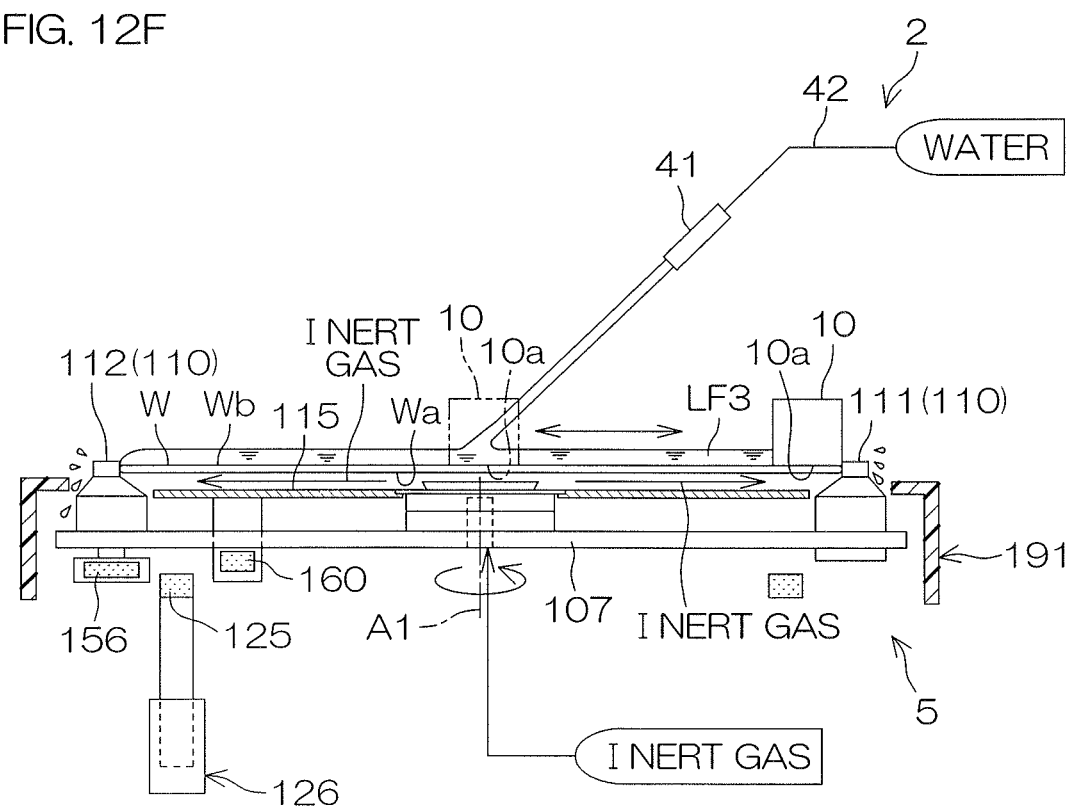

After a lapse of a predetermined period (sufficient to replace the liquid film LF4 of the ozone water on the substrate W with the liquid film LF3 of the water) from the start of the spouting of the water from the water nozzle 41, the controller 3 controls the arm driving unit 48 to scrub-clean the back surface Wb of the substrate W with the cleaning brush 10 as shown in FIG. 12F (T9: brush-cleaning step). Thus, the back surface Wb of the substrate W is scrub-cleaned with the cleaning brush 10 while the water is supplied to the back surface Wb of the substrate W. More specifically, the controller 3 controls the arm driving unit 48 to pivot the pivot arm 47 about the pivot axis A2 to move the cleaning brush 10 from the home position to above the substrate W and move the cleaning brush 10 downward to bring the cleaning surface 10a of the cleaning brush 10 into press contact with the back surface Wb of the substrate W. Then, the controller 3 controls the arm driving unit 48 to move (scan) the cleaning brush press-contact position between the center portion of the substrate W (the position indicated by the solid line in FIG. 9) and the peripheral portion of the substrate W (the position indicated by the two-dot-and-dash line in FIG. 9). Thus, the cleaning brush press-contact position is scanned over the entire back surface Wb of the substrate W, whereby the entire back surface Wb of the substrate W is scrubbed with the cleaning brush 10. The reciprocal movement of the cleaning brush 10 between the center portion and the peripheral portion of the substrate W requires, for example, 6.5 seconds. In the brush-cleaning step (T9), the foreign matter peeled off in the FOM supplying step (T6) is scrubbed off by the cleaning brush 10. The foreign matter scrubbed off by the cleaning brush 10 is washed away with the water. Thus, the peeled foreign matter is removed from the back surface Wb of the substrate W.

In the rinsing step (T8 and T9), the spouting flow rate of the water to be supplied to the back surface Wb of the substrate W is preferably as high as possible, but is desirably, for example, not higher than 0.8 L/min in order to prevent the water from flowing around to the front surface Wa.

In this embodiment, the scan width of the pivot arm 47 is set so that the substrate W can be cleaned up to very close to the peripheral edge of the substrate W with the cleaning brush 10.

Incidentally, where the back surface Wb of the substrate W is scrubbed with the cleaning brush 10 in a hydrophobic state, the foreign matter scrubbed off by the cleaning brush 10 is liable to be transferred to the hydrophobic back surface Wb to adhere to the back surface Wb. That is, the foreign matter is liable to adhere again to the back surface Wb of the substrate W via the cleaning brush 10.

In this embodiment, however, the ozone water supplying step (T7) is performed prior to the brush-cleaning step (T9). Therefore, the entire back surface Wb of the substrate W is kept hydrophilic at the start of the brush-cleaning step (T9), so that the foreign matter is prevented from adhering again to the back surface Wb of the substrate W via the cleaning brush 10 in the brush-cleaning step (T9).

In the brush-cleaning step (T9), therefore, the brush-cleaning (scrub-cleaning) process can be performed on the back surface Wb of the substrate W while the re-adhesion of the foreign matter to the back surface Wb of the substrate W is prevented or suppressed.

After the cleaning brush 10 is reciprocated a predetermined number of times (e.g., four times), the controller 3 controls the arm driving unit 48 to return the cleaning brush 10 from above the spin chuck 5 to the home position. Further, the controller 3 closes the water valve 43 to stop spouting the water from the water nozzle 41. The controller 3 closes the inert gas valve 173 to stop spouting the protection gas (inert gas) from the inert gas supply pipe 170. Thus, the brush-cleaning step (T9) ends.

By thus performing the process sequence from the FOM supplying step (T6) to the brush-cleaning step (T9), most of the chuck marks can be removed from the entire back surface Wb of the substrate W. This improves the yield in a subsequent process (e.g., an exposure process) to be performed after the cleaning process sequence.

Subsequently, a spin-drying step (Step T10) of drying the substrate W is performed. More specifically, the controller 3 controls the rotative driving unit 103 to accelerate the substrate W to a drying rotation speed (e.g., several thousands rpm) higher than the rotation speed employed in the process sequence from the FOM supplying step (T6) to the brush-cleaning step (T9) and rotate the substrate W at the drying rotation speed. Thus, a greater centrifugal force is exerted on the liquid present on the substrate W, whereby the liquid adhering to the substrate W is spun off around the substrate W. Thus, the liquid is removed from the substrate W to dry the substrate W.

If the spin-drying step is performed on the substrate W with the processing surface of the substrate W (i.e., the back surface Wb of the substrate W) in a hydrophobic state, for example, the water is liable to move in the form of water droplets on the processing surface in the spin-drying step, resulting in a substrate processing failure.

In this embodiment, in contrast, the ozone water supplying step (T7) is performed after the FOM supplying step (T6), so that the spin-drying step (T10) is performed on the substrate W with the back surface Wb of the substrate W kept hydrophilic. Thus, the substrate processing failure can be suppressed or prevented in the spin-drying step (T10).

After a lapse of a predetermined period from the start of the high-speed rotation of the substrate W, the controller 3 controls the rotative driving unit 103 to stop the rotation of the substrate W by the spin chuck 5 (Step T11).

Then, the controller 3 controls the magnet lift unit 126 to move the vertically movable permanent magnet 125 down to the lower position (Step T12). Thus, the distances between the vertically movable permanent magnet 125 and the protection disk permanent magnets 160 are increased to reduce the magnetic repulsive forces occurring therebetween. Correspondingly, the protection disk 115 is moved down toward the upper surface of the turntable 107. Thus, the space sufficient for receiving the hand H2 of the center robot CR is provided between the upper surface of the protection disk 115 and the front surface Wa (lower surface) of the substrate W. On the other hand, the vertically movable permanent magnet 125 is brought out of the opposed relation to the pin driving permanent magnets 156, so that the external forces biasing the movable pins 112 to the holding positions are lost. Therefore, the movable pins 112 respectively receive the resilient pressing forces from the resilient pressing members (not shown) to be biased to the release positions. Thus, the substrate W is unclamped.

Then, the substrate W is unloaded from the processing chamber 4 (Step T13). More specifically, the controller 3 controls the center robot CR to insert the hand H2 into the space defined between the protection disk 115 and the front surface Wa (lower surface) of the substrate W with all the nozzles and the like retracted from above the spin chuck 5. In turn, the hand H2 lifts the substrate W held by the holder pins 110, and then is retracted to the lateral side of the spin chuck 5. Thus, the substrate W subjected to the cleaning process is unloaded from the processing chamber 4.

The controller 3 causes the hand H2 of the center robot CR to transport the cleaned substrate W to the inversion unit TU. Then, the controller 3 causes the inversion unit TU to invert the transported substrate W (Step T14). Thus, the front surface Wa of the substrate W faces up. Thereafter, the controller 3 causes the hand H1 of the indexer robot IR to take out the substrate W from the inversion unit TU and place the cleaned substrate W in the carrier C with the front surface Wa of the substrate W facing up. The carrier C containing the cleaned substrate W is transported from the substrate processing apparatus 1 to a post-processing apparatus such as an exposure apparatus.

In this embodiment, as described above, the ozone water supplying step (T7) of supplying the ozone water to the back surface Wb of the substrate W is performed before the start of the brush-cleaning step (T9) after the FOM supplying step (T6).

In the FOM supplying step (T6), the FOM is supplied to the back surface Wb of the substrate W, whereby the silicon oxide film is formed in the back surface Wb of the substrate W (silicon substrate) by the oxidizing action of ozone contained in the FOM. Further, the silicon oxide film formed in the back surface Wb of the substrate W is peeled off (lifted off) from the back surface Wb by the oxide film etching action of hydrofluoric acid contained in the FOM. Thus, the foreign matter (particles, impurities, peelings of the back surface Wb of the substrate W, and the like) is removed from the back surface Wb of the substrate W, and the flaws (chippings, dents, and the like) formed in the back surface Wb of the substrate W are removed. Since ozone having a strong oxidative power is used, the oxide film can be formed in a greater amount in the back surface Wb of the substrate W. Therefore, the greater amount of oxide film can be removed from the back surface Wb of the substrate W. Thus, the foreign matter and/or the flaws can be efficiently removed from the back surface Wb of the substrate W.

Further, the ozone water supplying step (T7) of supplying the ozone water to the back surface Wb of the substrate W is performed before the start of the brush-cleaning step (T9). Even if the peripheral portion of the back surface Wb of the substrate W is hydrophobic at the end of the FOM supplying step (T6), therefore, the hydrophobic area can be hydrophilized by preforming the ozone water supplying step (T7) after the FOM supplying step (T6). Therefore, the entire back surface Wb of the substrate W is hydrophilic at the start of the brush-cleaning step (T9), so that the brush-cleaning step (T9) can be performed on the entirely hydrophilic back surface Wb of the substrate W. This prevents the foreign matter from adhering again to the back surface Wb of the substrate W via the cleaning brush 10 in the brush-cleaning step (T9).

Where ozone is not distributed to the peripheral portion of the back surface Wb of the substrate W in the FOM supplying step (T6), the cleaning efficiency (cleaning rate) of the peripheral portion of the back surface Wb of the substrate W is liable to be reduced. The ozone water supplying step (T7) functions to oxidize the once hydrophobized area by the supply of the ozone water to hydrophilize this area. However, the FOM is not supplied, so that the process does not proceed on the back surface Wb of the substrate W. Therefore, the peripheral portion of the back surface Wb of the substrate W is liable to be partly left uncleaned by this cleaning process sequence.

However, as described above, this cleaning process is intended to remove most of the chuck marks (roughly remove the chuck marks) from the back surface Wb of the substrate W. There is no particular problem even if the peripheral portion of the back surface Wb of the substrate W is partly left uncleaned.

The ozone water to be supplied to the back surface Wb of the substrate W in the ozone water supplying step (T7) has an ozone concentration of not lower than 50 ppm. Therefore, the entire back surface Wb of the substrate W can be properly hydrophilized. Thus, the brush-cleaning step (T9) can be performed with the entire back surface Wb of the substrate W hydrophilized.

Further, the FOM supplying step (T6) and the brush-cleaning step (T9) are not performed in parallel, but the scrub cleaning with the cleaning brush is performed after the FOM supplied to the substrate W is replaced with water. This prevents the cleaning brush 10 from being corroded by hydrofluoric acid and ozone contained in the FOM. Thus, the service life of the cleaning brush 10 can be prolonged.

It is also conceivable to supply the ozone water to the back surface Wb of the substrate W before the FOM supplying step (T6) rather than after the FOM supplying step (T6). In this case, however, it is difficult to maintain the hydrofluoric acid concentration and the ozone concentration of the FOM supplied onto the back surface Wb of the substrate W at the predetermined concentration levels because of the presence of the ozone water on the back surface Wb of the substrate W at the start of the FOM supplying step (T6). That is, it is difficult to properly balance the hydrofluoric acid concentration and the ozone concentration of the FOM supplied onto the back surface Wb of the substrate W.

<First Cleaning Test>

Next, a first cleaning test will be described. In the first cleaning test, the cleaning process was performed on a total of eleven samples according to Examples 1 and 2 and Comparative Example.

Example 1

Figure 14:
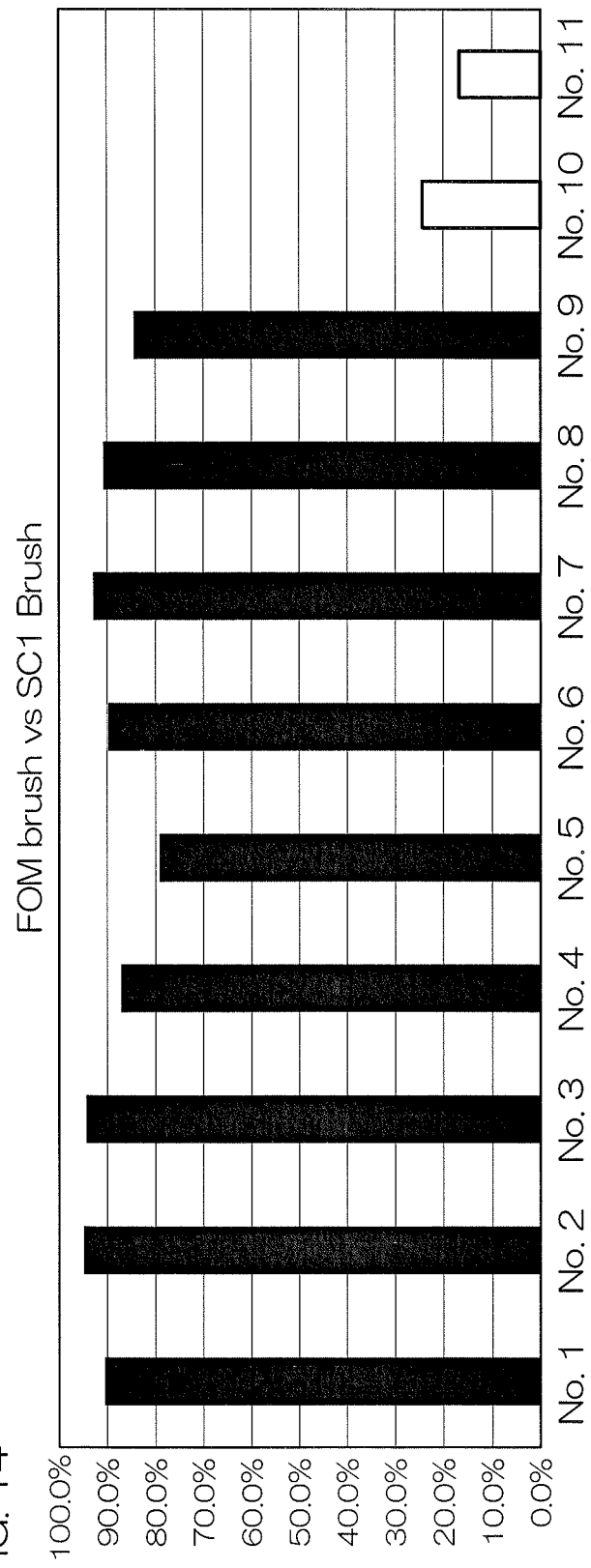
FIG. 14 is a graph showing the test results of a first cleaning test.

Bare silicon wafers W (having a diameter of 300 mm) each having chuck marks formed in a processing surface (non-device-formation surface) thereof by an electrostatic chuck were employed as samples. The FOM was supplied as the cleaning chemical liquid to the processing surface. In Example 1, the cleaning process was performed on the processing surface of each of the wafers W in the same manner as shown in FIG. 11. At this time, the FOM supplied to the processing surface in the FOM supplying step (T6) had a hydrofluoric acid concentration of 0.093 wt. % and an ozone concentration of 43.75 ppm, and the supply flow rate of the FOM was 0.8 L/min. Further, the ozone water supplied to the processing surface in the ozone water supplying step (T7) had an ozone concentration of 50 ppm, and the supply flow rate of the ozone water was 0.8 L/min. In FIG. 14 to be described later, sample Nos. 1 to 3 were treated according to Example 1.

Example 2

Bare silicon wafers W (having a diameter of 300 mm) each having chuck marks formed in a processing surface (non-device-formation surface) thereof by an electrostatic chuck were employed as samples. The FOM was supplied as the cleaning chemical liquid to the processing surface. In Example 2, the cleaning process was performed on each of the wafers W in substantially the same manner as shown in FIG. 11 but excluding Step T7. At this time, the FOM supplied to the processing surface in the FOM supplying step (T6) had a hydrofluoric acid concentration of 0.093 wt. % and an ozone concentration of 50 ppm, and the supply flow rate of the FOM was 0.8 L/min. In FIG. 14 to be described later, sample Nos. 4 to 9 were processed according to Example 2.

Comparative Example

Bare silicon wafers W (having a diameter of 300 mm) each having chuck marks formed in a processing surface (non-device-formation surface) thereof by an electrostatic chuck were employed as samples. SC1 was supplied as the cleaning chemical liquid to the processing surface. In Comparative Example, the cleaning process was performed on each of the wafers W in substantially the same manner as shown in FIG. 11, except that Step T7 was excluded and SC1 was used instead of the FOM as the cleaning chemical liquid. In FIG. 14 to be described later, sample Nos. 10 and 11 were processed according to Comparative Example.

The particle removal rates of sample Nos. 1 to 11 subjected to the cleaning process in the aforementioned manners were determined. The particle removal rates were each determined by dividing the number of particles removed from the processing surface of the wafer W by the cleaning process by the number of particles present on the processing surface before the cleaning process. The results are shown in FIG. 14.

FIG. 14 indicates that Examples employing the FOM as the cleaning chemical liquid are significantly improved in particle removal rate as compared with Comparative Example employing the SC1 as the cleaning chemical liquid. <Second Cleaning Test>

The inventors of the present invention assumed that the addition of the ozone water supplying step (T7) suppresses the so-called peripheral mode and improves the cleaning efficiency. To verify this assumption, a second cleaning test was performed.

In the second cleaning test, bare silicon wafers W (having a diameter of 300 mm) each having chuck marks formed in a processing surface (non-device-formation surface) thereof by an electrostatic chuck were employed as samples. The cleaning process was performed on each of the wafers W in substantially the same manner as shown in FIG. 11 by performing the ozone water supplying step (T7) for different periods. At this time, the FOM to be supplied to the processing surface in the FOM supplying step (T6) was prepared by mixing dilute hydrofluoric acid having a hydrofluoric acid concentration of 1.106 wt. % (a hydrofluoric acid/water volume ratio of 1:50) and ozone water in a ratio of 1:7. At this time, the FOM had a hydrofluoric acid concentration of 0.138 wt. %. Further, the ozone water supplied to the processing surface in the ozone water supplying step (T7) had an ozone concentration of 50 ppm, and the supply flow rate of the ozone water was 0.7 L/min. In the brush-cleaning step (T9), the supply flow rate of the water (DIW) was 500 mL/min.

The ozone water supplying step (T7) was performed on the wafers W for 2 seconds and 5 seconds, respectively. After the cleaning process, the processing surfaces of the wafers W were visually observed.

Where the period of the ozone water supplying step (T7) was 2 seconds, the processing surface of the wafer W suffered from the peripheral mode. Where the period of the ozone water supplying step (T7) was 5 seconds, on the other hand, the processing surface of the wafer W was free from the peripheral mode.

While one embodiment of the present invention has thus been described, the invention may be embodied in other ways.

In the above description, the ozone water supplying step (T7) is performed before the start of the brush-cleaning step (T9) after the FOM supplying step (T6) by way of example. The ozone water supplying step (T7) may be performed in parallel with the brush-cleaning step (T9). In other words, after the FOM supplying step (T6), the back surface Wb of the substrate W may be scrubbed with the cleaning brush 10 while the ozone water is supplied to the back surface Wb. In this case, PTFE is desirably used instead of the PVA as the material for the cleaning brush 10. Since the PTFE is resistant to the ozone water, the corrosion of the cleaning brush 10 by the ozone water can be suppressed or prevented.

In the above description, the FOM is applied to the center portion of the back surface Wb of the substrate W in the FOM supplying step (T6) by way of example. Alternatively, the FOM application position may be moved between the center portion and the peripheral portion of the back surface Wb of the substrate W to be scanned over the entire back surface Wb of the substrate W in the FOM supplying step (T6).

Further, the substrate W is not necessarily required to be rotated in the FOM supplying step (T6). In the brush-cleaning step (T9), the cleaning brush press-contact position on the substrate W may be moved within a plane of the substrate W by moving the cleaning brush 10 without rotating the substrate W.

In the cleaning process described above, a hydrofluoric acid supplying step of supplying hydrofluoric acid to the back surface Wb of the substrate W may be additionally performed before and/or after the FOM supplying step (T6). In this case, the controller 3 closes only the ozone water valve 27 with the hydrofluoric acid valve 25 kept open to spout hydrofluoric acid from the outlet port 37 of the FOM nozzle 6.

A first example of the hydrofluoric acid supplying step is a hydrofluoric acid supplying step to be performed before the FOM supplying step (T6) after the start of the rotation of the substrate W (T5).

A second example of the hydrofluoric acid supplying step is a hydrofluoric acid supplying step to be performed before the ozone water supplying step (T7) after the end of the FOM supplying step (T6).

A third example of the hydrofluoric acid supplying step includes a hydrofluoric acid supplying step to be performed before the FOM supplying step (T6) after the start of the rotation of the substrate W (T5) and a hydrofluoric acid supplying step to be performed before the ozone water supplying step (T7) after the end of the FOM supplying step (T6).

The silicon oxide film formed in the back surface Wb of the substrate W can be removed by the hydrofluoric acid supplying step. In this case, the back surface Wb of the substrate W is hydrophobized by the hydrofluoric acid supplying step. However, the ozone water supplying step (T7) always follows the hydrofluoric acid supplying step, so that the back surface Wb of the substrate W is hydrophilized in the ozone water supplying step (T7). This eliminates the possibility that the hydrophobized back surface Wb of the substrate W is scrubbed with the cleaning brush 10, thereby preventing the foreign matter from adhering again to the back surface Wb of the substrate W in the brush-cleaning step (T9). Further, there is no possibility that the back surface Wb of the substrate W is dried in a hydrophobic state, so that the substrate treatment failure can be suppressed or prevented in the spin-drying step (T10).

In the embodiment described above, the FOM supplying unit of the nozzle mixing type adapted to mix the dilute hydrofluoric acid and the ozone water in the FOM nozzle 6 is employed by way of example. Alternatively, an FOM supplying unit of a pipe mixing type may be employed, which includes a mixing portion provided upstream of the FOM nozzle 6 and connected to the FOM nozzle 6 via a pipe and is adapted to mix the dilute hydrofluoric acid and the ozone water in the mixing portion.

Further, the FOM may be prepared not only by mixing the dilute hydrofluoric acid and the ozone water together, but also by dissolving ozone directly in the dilute hydrofluoric acid.

Further, a dilute hydrofluoric acid nozzle which spouts the dilute hydrofluoric acid and an ozone water nozzle which spouts the ozone water may be provided, so that the dilute hydrofluoric acid from the dilute hydrofluoric acid nozzle and the ozone water from the ozone water nozzle are mixed together on the back surface Wb of the substrate W to prepare the FOM.

In the embodiment described above, the FOM supplying unit doubles as the ozone water supplying unit, but the ozone water supplying unit may be provided separately from the FOM supplying unit. In this case, an ozone water nozzle which spouts the ozone water may be provided separately from the FOM nozzle 6, and the ozone water may be supplied to the back surface Wb of the substrate W from the ozone water nozzle in the ozone water supplying step (T7).

In this case, the ozone water nozzle may be disposed with its spout directed toward the peripheral portion of the back surface Wb of the substrate W, so that the ozone water can be spouted toward the peripheral portion of the back surface Wb of the substrate W from the ozone water nozzle in the ozone water supplying step (T7) (peripheral portion ozone water spouting step). In this case, the ozone water spouted toward the peripheral portion of the back surface Wb of the substrate W is supplied to the entire peripheral portion of the back surface Wb of the substrate W by the rotation of the substrate W. Thus, the peripheral portion of the back surface Wb of the substrate W can be efficiently hydrophilized, whereby the re-adhesion of the foreign matter to the back surface Wb of the substrate W can be suppressed or prevented in the brush-cleaning step (T9).

Further, the arrangement for protecting the surface of the substrate W opposite from the processing surface with the protection gas may be obviated.

In the above description, the cleaning process sequence is adapted for the removal of the foreign matter from the back surface Wb of the substrate W, particularly for the removal of the chuck marks formed in the back surface Wb, but may be intended to remove not only the chuck marks but also flaws including film peelings, minute scratches and the like.

In the above description, the processing surface to be processed is the bare silicon surface of the substrate (silicon substrate) W. The silicon surface to be processed is not limited to the bare silicon surface, but may include a silicon oxide film and/or a silicon nitride film.

In the above description, the processing surface to be processed is the back surface (non-device-formation surface) Wb of the substrate W, but may be the front surface (device formation surface) Wa of the substrate W. In this case, the processing surface may include a silicon oxide film, a silicon nitride film and a metal film (e.g., a titanium nitride film and the like). In this case, the cleaning process sequence is not only intended to remove the foreign matter but also intended to remove the metal and impurities buried in the films.

In the above description, the processing surface is the upper surface of the substrate W, but may be the lower surface of the substrate W.

In the above description, the substrate processing apparatus 1 is adapted to treat the disk-shaped semiconductor substrate, but may be adapted to treat a polygonal substrate such as a glass substrate for a liquid crystal display device.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2016-61909 filed in the Japan Patent Office on Mar. 25, 2016, the disclosure of which is incorporated herein by reference in its entirety.

REFERENCE SIGNS LIST

1: SUBSTRATE PROCESSING APPARATUS
2: PROCESSING UNIT
3: CONTROLLER
4: PROCESSING CHAMBER
5: SPIN CHUCK
6: FOM NOZZLE (OZONE-CONTAINING HYDROFLUORIC ACID SOLUTION SUPPLYING UNIT)
7: FOM SUPPLYING DEVICE (OZONE-CONTAINING HYDROFLUORIC ASID SOLUTION SUPPLYING UNIT)
8: WATER SUPPLYING UNIT
10: CLEANING BRUSH
10a: CLEANING SURFACE
21: NOZZLE ARM
22: NOZZLE MOVING UNIT
23: HYDROFLUORIC ACID PIPE
24: OZONE WATER PIPE
25: HYDROFLUORIC ACID VALVE
26: HYDROFLUROIC ACID FLOW RATE CONTROL VALVE
27: OZONE WATER VALVE
28: OZONE WATER FLOW RATE CONTROL VALVE
47: PIVOT ARM
48: ARM DRIVING UNIT
103: ROTATIVE DRIVING UNIT
107: TURNTABLE
110: HOLDER PINS
111: IMMOVABLE PINS
112: MOVABLE PINS
115: PROTECTION DISK
170: INERT GAS SUPPLY PIPE
172: INERT GAS SUPPLY LINE
173: INERT GAS VALVE
174: INERT GAS FLOW RATE CONTROL VALVE
190: THROTTLING PORTIONS
191: COVER
192: ANNULAR PLATE PORTION
193: HOLLOW CYLINDRICAL PORTION
M: METAL LAYER
W: SUBSTRATE
Wa: FRONT SURFACE
Wb: BACK SURFACE

The invention claimed is:

1. A substrate processing method comprising:
a substrate holding step of causing a substrate holding unit to hold a substrate in a horizontal orientation, the substrate having one major surface and an other major surface, the one major surface being a non-device-formation surface in which no device is formed, the other major surface being a device formation surface in which a device is formed;
a substrate rotating step of rotating the substrate about a predetermined rotation axis that passes through a center portion of the one major surface of the substrate;
an ozone-containing hydrofluoric acid solution supplying step of supplying an ozone-containing hydrofluoric acid solution containing ozone dissolved in a hydrofluoric acid solution to the one major surface of the substrate held by the substrate holding unit by spouting the ozone-containing hydrofluoric acid solution toward the center portion of the one major surface in the substrate rotating step, thereby forming a liquid film composed of the supplied ozone-containing hydrofluoric acid solution such that the liquid film entirely covers the one major surface of the substrate, the ozone-containing hydrofluoric acid solution having a hydrofluoric acid concentration of not lower than 0.093 wt. % and not higher than 0.221 wt. %, and having an ozone concentration of not lower than 22.5 ppm and not higher than 42.0 ppm;
a protection fluid supplying step of supplying a protection fluid to the other major surface of the substrate so as to substantially prevent the ozone-containing hydrofluoric acid solution from flowing around to the other major surface of the substrate in the ozone-containing hydrofluoric acid solution supplying step;
a brush-cleaning step of cleaning the one major surface of the substrate by bringing a cleaning brush into contact with the one major surface of the substrate after the ozone-containing hydrofluoric acid solution supplying step; and
an ozone water supplying step of supplying ozone water having an ozone concentration of not lower than 50 ppm to the one major surface of the substrate before start of the brush-cleaning step after the ozone-containing hydrofluoric acid solution supplying step so as to entirely hydrophilize the one major surface of the substrate.

2. The substrate processing method according to claim 1, wherein the ozone water supplying step comprises a center portion ozone water spouting step of spouting the ozone water toward the center portion of the one major surface of the substrate.

3. The substrate processing method according to claim 1, wherein the ozone water supplying step comprises a peripheral portion ozone water spouting step of spouting the ozone water toward a peripheral portion of the one major surface of the substrate.

4. The substrate processing method according to claim 1, wherein the substrate comprises a semiconductor substrate.

5. The substrate processing method according to claim 4, wherein the device formation surface comprises a metal layer.

6. The substrate processing method according to claim 1, wherein the protection fluid supplying step comprises a protection gas supplying step of supplying a protection gas to the other major surface.

7. The substrate processing method according to claim 1, wherein the ozone-containing hydrofluoric acid solution supplying step comprises the step of spouting the ozone-containing hydrofluoric acid solution to an upper surface of the substrate which is the one major surface of the substrate,
wherein the brush-cleaning step comprises the step of cleaning the upper surface of the substrate.

8. The substrate processing method according to claim 1, wherein the one major surface of the substrate comprises a silicon-containing surface which comprises a silicon component.

9. The substrate processing method according to claim 1, wherein the one major surface of the substrate comprises a titanium nitride-containing surface which comprises titanium nitride.

10. The substrate processing method according to claim 1, wherein a rotation speed of the substrate in the substrate rotating step is in a range of 300 rpm to 1500 rpm.

11. The substrate processing method according to claim 1, wherein a rotation speed of the substrate in the substrate rotating step is in a range of 300 rpm to 500 rpm.

* * * * *